(12) United States Patent
Narita

(10) Patent No.: US 7,068,279 B2
(45) Date of Patent: Jun. 27, 2006

(54) IMAGE PROCESSING APPARATUS

(75) Inventor: Atsushi Narita, Tokyo (JP)

(73) Assignee: Sony Corporation (JP)

( * ) Notice: Subject to any disclaimer, the term of this patent is extended or adjusted under 35 U.S.C. 154(b) by 401 days.

(21) Appl. No.: 10/161,738

(22) Filed: Jun. 5, 2002

(65) Prior Publication Data

US 2002/0190993 A1 Dec. 19, 2002

(30) Foreign Application Priority Data

Jun. 6, 2001 (JP) ............................ P2001-171573

(51) Int. Cl.
*G06T 1/60* (2006.01)
(52) U.S. Cl. ...................... 345/530; 345/519; 345/544; 345/545
(58) Field of Classification Search ................. 345/519, 345/530, 544, 545; 365/222, 185.25
See application file for complete search history.

(56) References Cited

U.S. PATENT DOCUMENTS 6,233,192 B1 * 5/2001 Tanaka ........................ 365/222
6,295,074 B1 * 9/2001 Yamagishi et al. ......... 345/519

* cited by examiner

*Primary Examiner*—Matthew C. Bella
*Assistant Examiner*—Hau Nguyen
(74) *Attorney, Agent, or Firm*—Rader, Fishman & Grauer PLLC; Ronald P. Kananen

(57) ABSTRACT

An image processing apparatus capable of performing a refresh operation without causing a drop in performance, an increase in cost, or damage to the apparatus. The apparatus further being capable of achieving a reduction in power consumption, and being provided with a memory I/F circuit able to not only refresh, for example, four DRAM modules simultaneously, but also capable of refreshing two DRAM modules at a same timing, then refreshing the remaining two DRAM modules simultaneously at a next timing, or refreshing the four DRAM modules one by one in order based on given refresh control data, and controlling the timing of the refresh operation for each divided DRAM module.

13 Claims, 22 Drawing Sheets

MAKE SIDE EXTENDING LONGEST
IN Y-DIRECTION SIDE AC

FIG.17
TRIANGLES CAN BE DIVIDED IN THREE WAYS
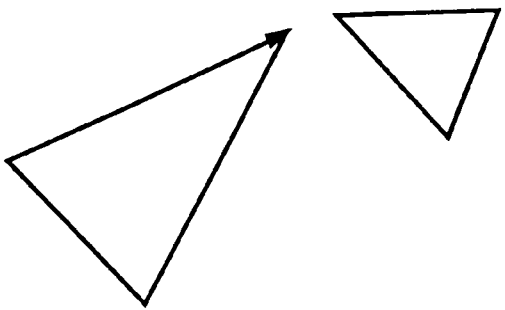
THERE IS ONE UPPERMOST VERTEX AND CONTINUING SIDE IS ON RIGHT SIDE
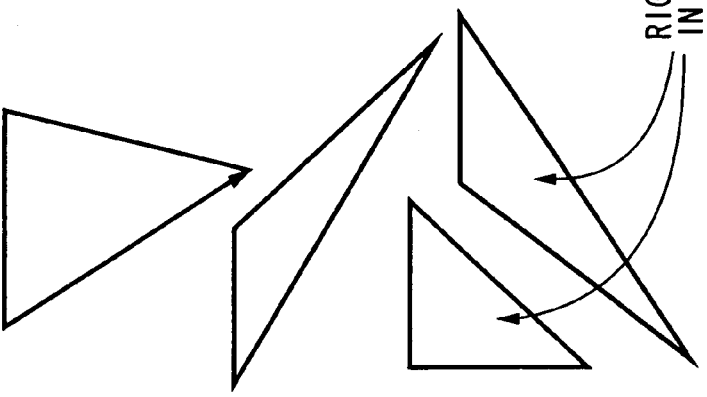
UPPER SIDE IS HORIZONTAL (LEFT SIDE BECOMES BASE)
RIGHT SIDE MAY BE BASE IN THESE CASES
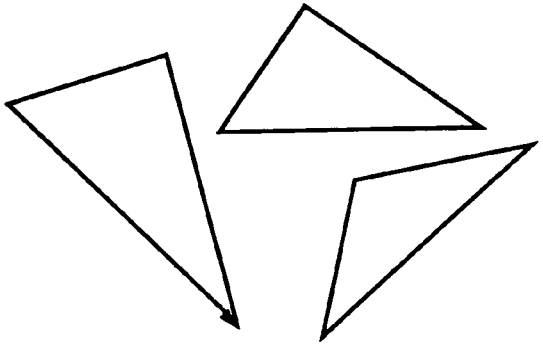
THERE IS ONE UPPERMOST VERTEX AND CONTINUING SIDE IS ON LEFT SIDE

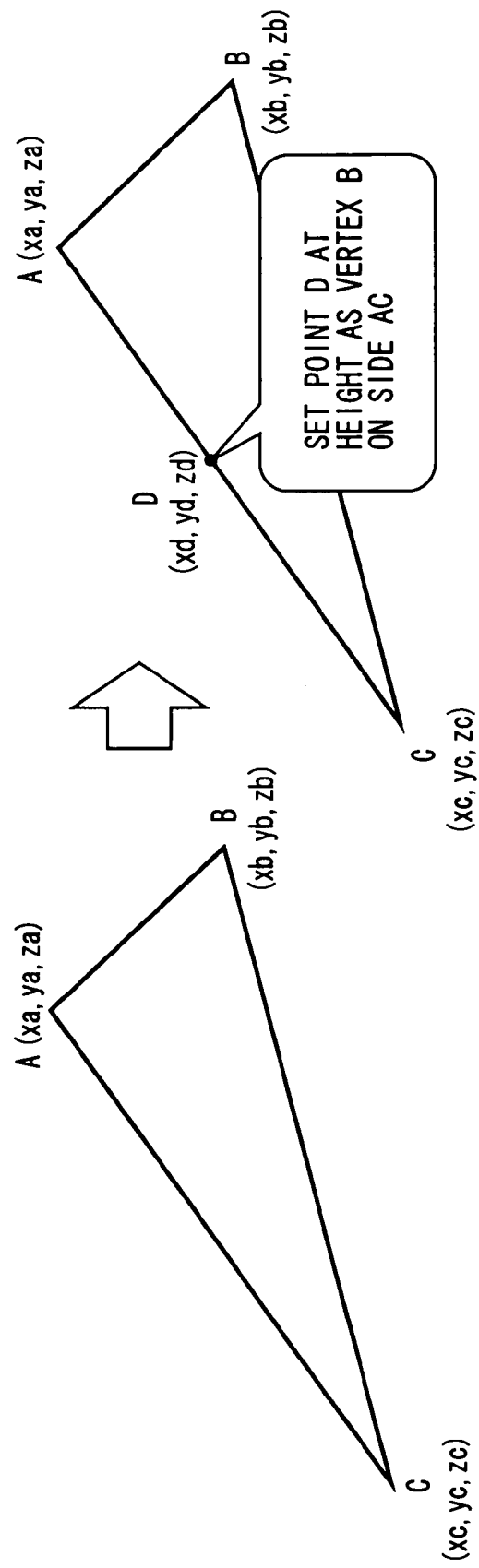

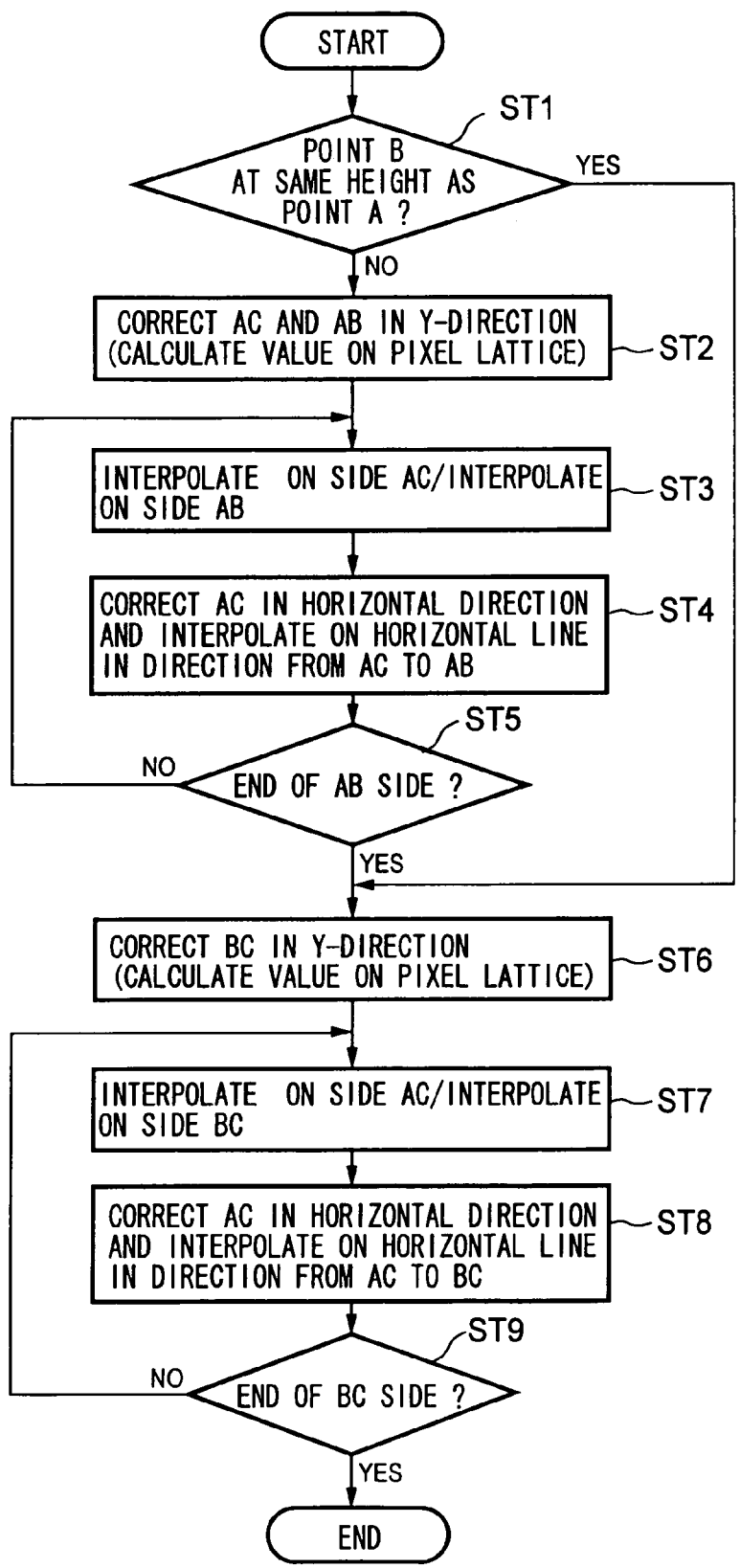

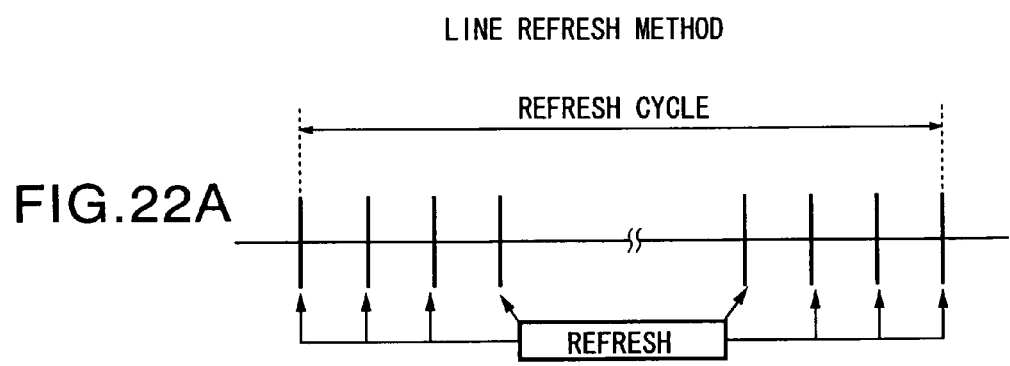
FIG.22A (LINE REFRESH METHOD)
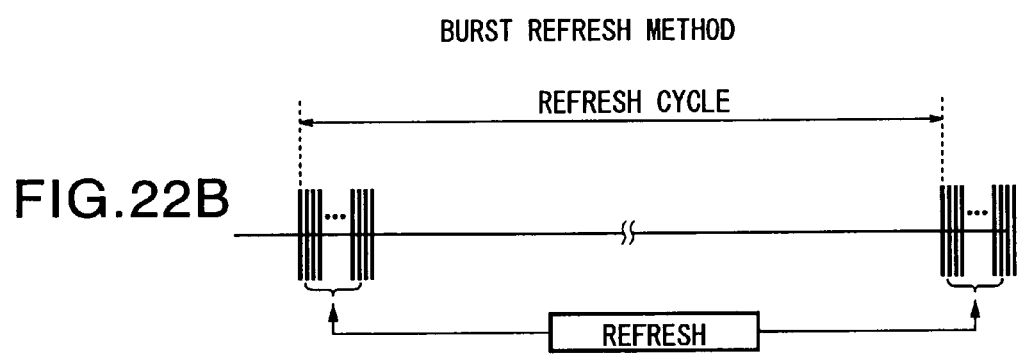
FIG.22B (BURST REFRESH METHOD)
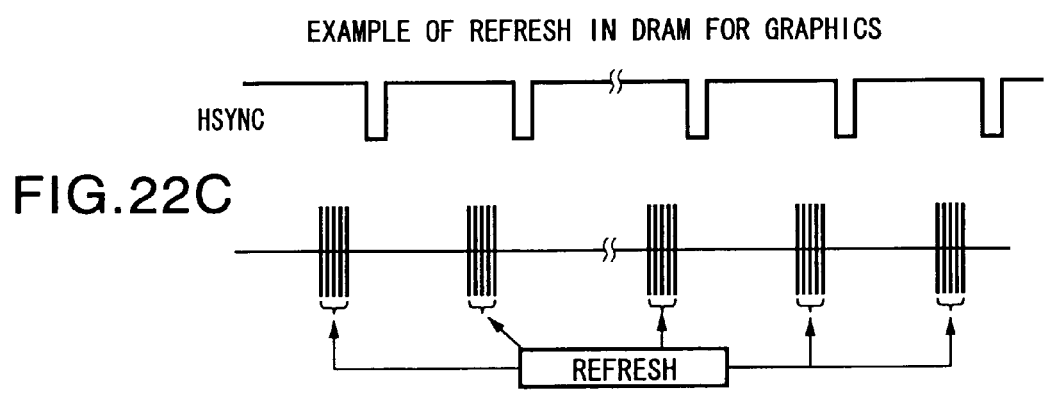
FIG.22C (EXAMPLE OF REFRESH IN DRAM FOR GRAPHICS)

IMAGE PROCESSING APPARATUS

BACKGROUND OF THE INVENTION

1. Field of the Invention

The present invention relates to a graphics drawing image processing apparatus and, more particularly, relates to a refresh technique of a built-in memory when accommodating a dynamic random access memory (DRAM) or other memory requiring refreshing and a logic circuit.

2. Description of the Related Art

Computer graphics are often used in a variety of computer aided design (CAD) systems and amusement machines. Especially, along with the recent advances in image processing techniques, systems using three-dimensional computer graphics are becoming rapidly widespread.

In three-dimensional computer graphics, the color value of each pixel is calculated at the time of deciding the color of each corresponding pixel. Then, rendering is performed for writing the calculated value of the pixel to an address of a display buffer (frame buffer) corresponding to the pixel.

One of the rendering methods is polygon rendering. In this method, a three-dimensional model is expressed as a composite of triangular unit graphics (polygons). By drawing the polygons as units, the colors of the display screen are decided.

In polygon rendering, coordinates (x, y, z), color data (R, G, B), homogeneous coordinates (s, t) of texture data indicating a composite image pattern and a value of the homogeneous term q for each vertex of the triangle in a physical coordinate system are input, and processing is performed for interpolation of these values inside the triangle.

Here, looking at the homogeneous term q, the coordinates in a UV coordinate system of an actual texture buffer, namely, texture coordinate data (u, v), are comprised of the homogeneous coordinates (s, t) divided by the homogeneous term q to give "s/q" and "t/q", which in turn are multiplied by texture sizes USIZE and VSIZE, respectively.

FIG. 21 is a view of the system configuration showing the basic concept of a three-dimensional computer graphics system.

In this three-dimensional computer graphics system, data for drawing graphics is supplied from a main memory 2 in a main processor 1 or from an input/output (I/O) interface circuit 3 for receiving graphic data from the outside via a main bus 4 to a rendering circuit 5 having a rendering processor 5a and a frame buffer memory 5b.

In the rendering processor 5a, a frame buffer memory 5b for holding data for display and a texture memory 6 for holding texture data to be applied on the surface of a graphic element (for example, a triangle) to be drawn are connected.

Then, the rendering processor 5a performs processing for drawing the graphic element applied with the texture on its surface for every graphic element in the frame buffer memory 5b.

The frame buffer memory 5b and the texture memory 6 are generally configured by a DRAM.

In the system of FIG. 21, the frame buffer memory 5b and the texture memory 6 are configured as physically separated memory systems.

In a graphics drawing image processing apparatus, however, the memory is frequently accessed, such as for writing and reading image data to and from the memory and for reading for display of the image. Further, it is necessary that a wide bus width of the memory be secured to obtain the full graphic drawing performance.

As a result, it has become physically impossible to separately arrange the graphics drawing image processing apparatus and memory due to the increase of the number of interconnections, so the DRAM and the logic circuit began to be accommodated on one chip.

Since a DRAM built-in on the same chip with the logic circuit uses capacitors for memory elements of memory cells, when a certain time passes, data stored in the capacitors of the memory cells as charges are lost due to leakage current or other disturbances.

Thus, as is well known, a refresh operation is performed based on a predetermined system on the DRAM to rewrite and maintain the data held by the memory cells.

Taking a 1 Megabit DRAM as an example, when one line address (page address) is selected, at the time of a refresh operation, the 2048 cells connected to the selected word line are refreshed simultaneously.

The standard of a refresh operation is, for example, calls for performing a refresh operation 512 cycles in 8 ms. All of the 512×2048=1M bits worth of cells are refreshed by this number of cycles.

As the systems for refreshing a DRAM, there are mainly the line refresh method shown in FIG. 22A and the burst refresh method shown in FIG. 22B.

Further, as a system for refreshing a memory for graphics, for example, as shown in FIG. 22C, the system is adopted of performing a number of refresh operations satisfying the standard for refresh operations in units of the horizontal synchronization signal HSYNC.

As explained above, in the graphics drawing image processing apparatus, it became easy to secure the bus width by arranging the memory inside the LSI.

However, the refresh operation causes the following disadvantages when making the built-in DRAM larger in capacity to improve the performance.

First, a refresh operation of a DRAM consumes a large amount of power, so the circuit is liable to stop operating normally if the operation is performed all at once due to the fluctuation in a power due to a voltage drop or noise.

Second, performing the refresh operation of a large scale DRAM all at once causes a large current to flow and may damage the device.

Third, it is difficult to judge whether a malfunction in a large-scale circuit is caused by a refresh operation or another reason.

Fourth, when a malfunction can be judged to be caused by a refresh operation, it may be difficult to check and measure the operation of the chip without a refresh operation and may become necessary to remake the chip with countermeasures.

Finally, fifth, even when the circuit does not malfunction, it becomes necessary to use a heat resistant ceramic or other package able to withstand the instantaneous power consumption at the time of a refresh operation, so the cost becomes higher compared with the case of using a plastic package.

SUMMARY OF THE INVENTION

An object of the present invention is to provide an image processing apparatus capable of efficiently performing a refresh operation without causing a drop in performance, an increase of the cost, or damage of the apparatus and capable of reducing the power consumption.

To attain the above object, according to a first aspect of the present invention, there is provided an image processing apparatus comprising a memory circuit divided into a plurality of memory modules and storing at least image data and requiring refreshing, a logic circuit for performing predetermined processing on the image data based on data stored in the memory circuit, the memory circuit and the logic circuit being accommodated on one semiconductor chip, and a refresh circuit for refreshing the memory circuit in units of divided memory modules.

According to a second aspect of the invention, there is provided an image processing apparatus for performing rendering by receiving polygon rendering data including three-dimensional coordinates (x, y, z), R (Red), G (green), and B (blue) data, homogeneous coordinates (s, t) of texture, and a homogeneous term q for vertexes of a unit graphic, comprising a memory circuit for storing display data and texture data required by at least one graphic element and requiring refreshing, a logic circuit comprising at least an interpolated data generation circuit for interpolating the polygon rendering data of the vertexes of the unit graphic to generate interpolated data of pixels positioned inside the unit graphic and a texture processing circuit for dividing the homogeneous coordinates (s, t) of texture included in the interpolated data by the homogeneous term q to generate "s/q" and "t/q", reading texture data from the memory circuit by using a texture address corresponding to the "s/q" and "t/q", and performing processing to apply the texture data to a surface of graphic elements of the display data, the memory circuit and the logic circuit being accommodated in one semiconductor chip, and a refresh circuit for refreshing the memory circuit in units of divided memory modules.

Preferably, the refresh circuit successively refreshes a plurality of memory modules in units of two memory modules.

Alternatively, the refresh circuit refreshes a plurality of memory modules one by one in a predetermined order.

Alternatively, the refresh circuit successively refreshes a plurality of memory modules in units of at least two memory modules when refresh control data given are first data, while it refreshes the plurality of memory modules one by one in a predetermined order when refresh control data is given are second data.

Alternatively, the refresh circuit refreshes in units of at least two memory modules, which are at least not adjacent to each other.

Alternatively, the refresh circuit successively refreshes a plurality of memory modules in units of at least two memory modules which are at least not adjacent to each other when refresh control data given are first data, while it refreshes the plurality of memory modules one by one in a predetermined order when refresh control data are second data.

According to a third aspect of the present invention, there is provided an image processing apparatus comprising a memory circuit divided into a plurality of memory modules and storing at least image data and requiring refreshing, a logic circuit for performing predetermined processing on the image data based on data stored in the memory circuit, the memory circuit and the logic circuit being accommodated in one semiconductor chip, and the plurality of divided memory modules arranged at a periphery of the logic circuit, and a refresh circuit for refreshing the memory circuit in units of divided memory modules.

According to a fourth aspect of the present invention, there is provided an image processing apparatus for performing rendering by receiving polygon rendering data including three-dimensional coordinates (x, y, z), R (Red), G (green), and B (blue) data, homogeneous coordinates (s, t) of texture, and a homogeneous term q for vertexes of a unit graphic, comprising a memory circuit for storing display data and texture data required by at least one graphic element and requiring refreshing, a logic circuit comprising at least an interpolated data generation circuit for interpolating polygon rendering data of the vertexes of the unit graphic to generate interpolated data of pixels positioned inside the unit graphic and a texture processing circuit for dividing the homogeneous coordinates (s, t) of texture included in the interpolated data by the homogeneous term q to generate "s/q" and "t/q", reading texture data from the memory circuit by using a texture address corresponding to the "s/q" and "t/q", and performing processing to apply the texture data to a surface of graphic elements of the display data, the memory circuit and the logic circuit being accommodated in one semiconductor chip, the plurality of divided memory modules arranged at a periphery of the logic circuit, and a refresh circuit for refreshing the memory circuit in units of divided memory modules.

Preferably, the refresh circuit successively refreshes the plurality of memory modules in units of at least two memory modules.

Alternatively, the refresh circuit refreshes the plurality of memory modules one by one in a predetermined order.

Alternatively, the refresh circuit successively refreshes a plurality of memory modules in units of at least two memory modules when refresh control data given are first data, while it refreshes the plurality of memory modules one by one in a predetermined order when refresh control data given are second data.

Alternatively, the memory modules are arranged at the periphery of the logic circuit so as to surround the logic circuit, and the refresh circuit successively refreshes the modules in units of at least two memory modules arranged facing different rims of the logic circuit.

Alternatively, the memory modules are arranged at the periphery of the logic circuit so as to surround the logic circuit, and the refresh circuit successively refreshes the plurality of memory modules in units of at least two memory modules arranged facing different rims of the logic circuit when refresh control data given is first data, while it refreshes the plurality of memory modules one by one in a predetermined order when refresh control data given are second data.

According to the present invention, the memory circuit is comprised of a plurality of independent modules. Due to this, the ratio of valid data occupying a bit line in each access is increased compared with the case where it is necessary to access the circuit simultaneously.

The plurality of divided memory modules are arranged at the periphery of the logic circuit for graphics drawing processing, etc.

As a result, the distances from the memory modules to the logic circuit become uniform and a length of the longest path interconnection becomes shorter compared with the case of gathering and arranging the modules in one direction. Thus, the overall operation speed is improved.

When refreshing the memory circuit by the refresh circuit, the refresh is performed in units of divided memory modules. For example, normally, all of memory modules are refreshed all together simultaneously.

However, when refresh control data are first data, if mutually adjoining memory modules arranged at the same rim (side) of the logic circuit are refreshed simultaneously, there are liable to be the effects of noise, effects of a voltage drop, etc. Therefore, for example, two memory modules arranged at mutually different rims (sides) of the logic circuit are refreshed simultaneously, then the memory modules arranged at the remaining two different rims (sides) are refreshed simultaneously.

When the refresh control data are second data, the plurality of memory modules are refreshed one by one in order at different timings.

As explained above, according to the present invention, it is possible not only to refresh a plurality of modules simultaneously, but also to refresh at least two memory modules simultaneously and refresh at least two memory modules simultaneously at the next timing, refresh the plurality of memory modules one by one in order, and otherwise control the refresh operation for every DRAM module.

By enabling the control of the refresh operation in units of memory modules, it is possible to estimate an effect given to a circuit by a refresh operation. When a refresh operation would cause a drop in the power or ground voltage or noise and trigger a malfunction, control of each DRAM module could keep down the power consumption, eliminate malfunctions, and reduce the package costs.

BRIEF DESCRIPTION OF THE DRAWINGS

These and other objects and features of the present invention will become clearer from the following description of the preferred embodiments given with reference to the attached drawings, in which:

FIG. 17 is a view for explaining sorting of vertexes of the triangle DDA circuit according to the present invention;

FIG. 18 is a view for explaining processing for calculation of gradient in the horizontal direction of the triangle DDA circuit according to the present invention;

FIG. 20 is a flow chart for explaining a routine for interpolation of vertex data of the triangle DDA circuit according to the present invention;

FIGS. 22A to 22C are views for explaining a method of refreshing a DRAM.

DESCRIPTION OF THE PREFERRED EMBODIMENTS

Below, in the present embodiment, an explanation will be made of a three-dimensional computer graphics system for displaying a desired three-dimensional image of any three-dimensional object model at a high speed on a cathode ray tube (CRT) or other display, which is often used in personal computers, etc.

Figure 1:
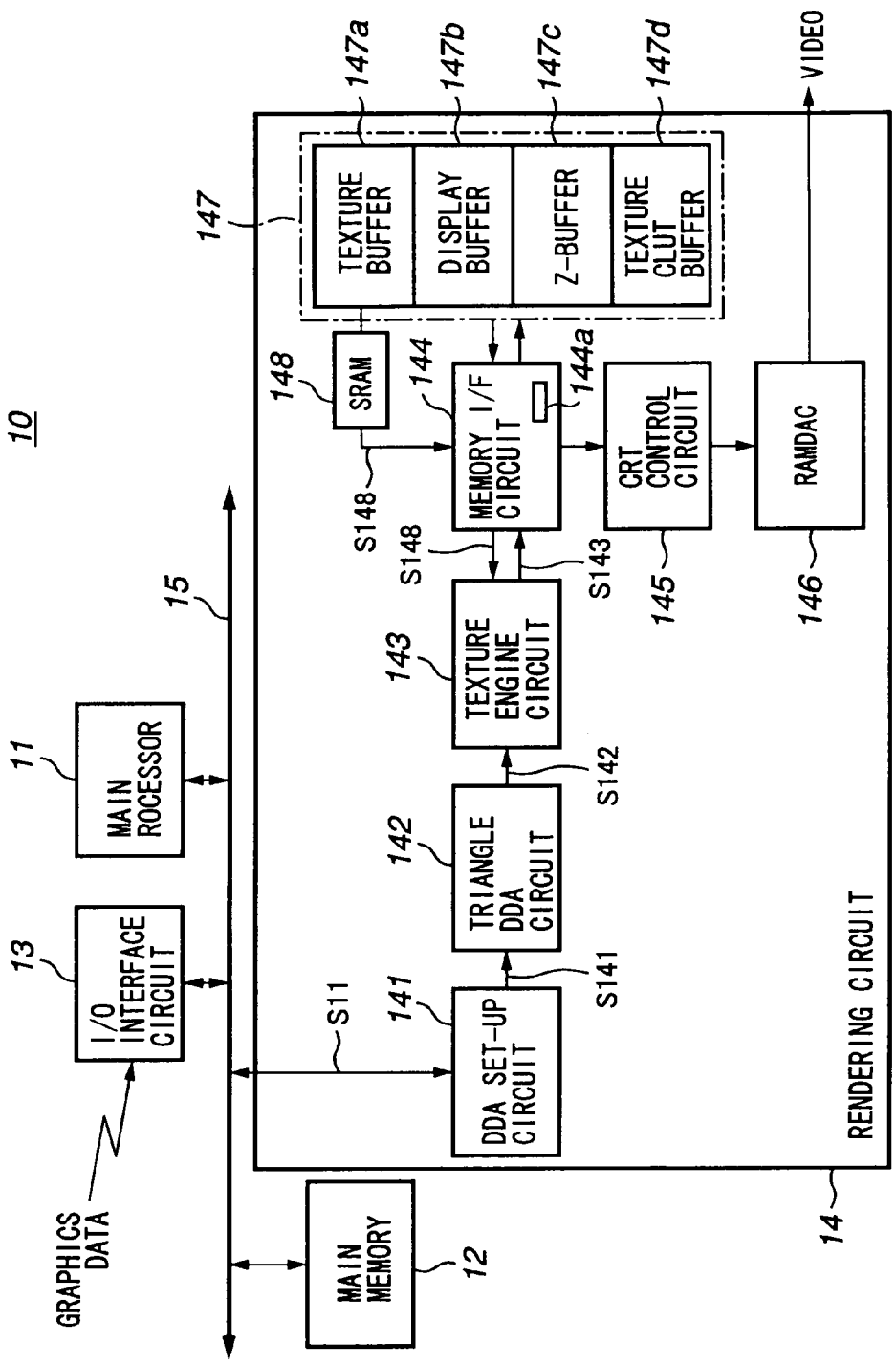
FIG. 1 is a block diagram of the configuration of a three-dimensional computer graphics system according to the present invention.

FIG. 1 is a view of the system configuration of a three-dimensional computer graphics system 10 as an image processing apparatus according to the present invention.

The three-dimensional computer graphics system 10 expresses a three-dimensional model as a composite of triangular unit graphics (polygons). By drawing the polygons, this system decides the colors of the pixels of the display screen and performs the polygon rendering for display on the display.

Further, in the three-dimensional computer graphics system 10, a three-dimensional object is expressed by using a z-coordinate indicating depth in addition to the coordinates (x, y) indicating a position on a plane. The three coordinates (x, y, z) specify any one point in a three-dimensional space.

As shown in FIG. 1, the three-dimensional computer graphics system 10 is connected to a main processor 11, a main memory 12, an I/O interface circuit 13, and a rendering circuit 14 via a main bus 15.

Below, the functions of the respective components will be explained.

The main processor 11 reads the necessary graphic data from the main memory 12 in accordance with, for example, the state of progress of an application and performs clipping, lighting, and geometric processing, etc. on the graphic data and generates polygon rendering data. The main processor 11 outputs the polygon rendering data S11 to the rendering circuit 14 via the main bus 15.

The I/O interface circuit 13 receives as input the motion control information or the polygon rendering data from the outside in accordance with need and outputs the same to the rendering circuit 14 via the main bus 15.

The polygon rendering data includes the data (x, y, z, R, G, B, s, t, q) of each of the three vertexes of the polygon.

Here, the (x, y, z) data indicates the three-dimensional coordinates of a vertex of the polygon, and (R, G, B) indicates the luminance values of red, green, and blue at the three-dimensional coordinates, respectively.

Among the (s, t, q) data, the (s, t) indicates homogeneous coordinates of a corresponding texture and the q indicates a homogeneous term. Here, the texture sizes USIZE and VSIZE are respectively multiplied with the "s/q" and "t/q" to obtain the texture coordinate data (u, v). The texture coordinate data (u, v) are used for accessing the texture data stored in the texture buffer.

Namely, the polygon rendering data comprise physical coordinate values of the vertexes of a triangle and colors and texture data of each of the vertexes.

Below, a rendering circuit 14 accommodating a logic circuit and a DRAM together and adopting a refresh method according to the present invention will be explained in detail.

As shown in FIG. 1, the rendering circuit 14 comprises a digital differential analyzer (DDA) set-up circuit 141, a triangle DDA circuit 142, a texture engine circuit 143, a memory interface (I/F) circuit 144 including a function as a refresh circuit, a CRT control circuit 145, a RAMDAC circuit 146, a DRAM 147, and a static RAM (SRAM) 148.

The rendering circuit 14 in the present embodiment accommodates a logic circuit and a DRAM 147 for storing at least display data and texture data in one semiconductor chip.

In the present embodiment, the configuration of the DRAM 147, an arrangement and interconnection method of the logic circuit accommodated together therewith in the same semiconductor chip, and the function of the memory I/F circuit 144 including refresh control of the DRAM 147 will be explained first. Then, functions of the DDA set-up circuit 141, the triangle DDA circuit 142, the texture engine circuit 143, a CRT control circuit 145, and the RAMDAC circuit 146 will be explained in that order.

DRAM 147

The DRAM 147 functions as a texture buffer 147*a*, a display buffer 147*b*, a z-buffer 147*c*, and a texture color look-up table (CLUT) buffer 147*d*.

Further, the DRAM 147 is divided into a plurality of modules (4 or 8 etc.) having identical functions.

Figure 2:
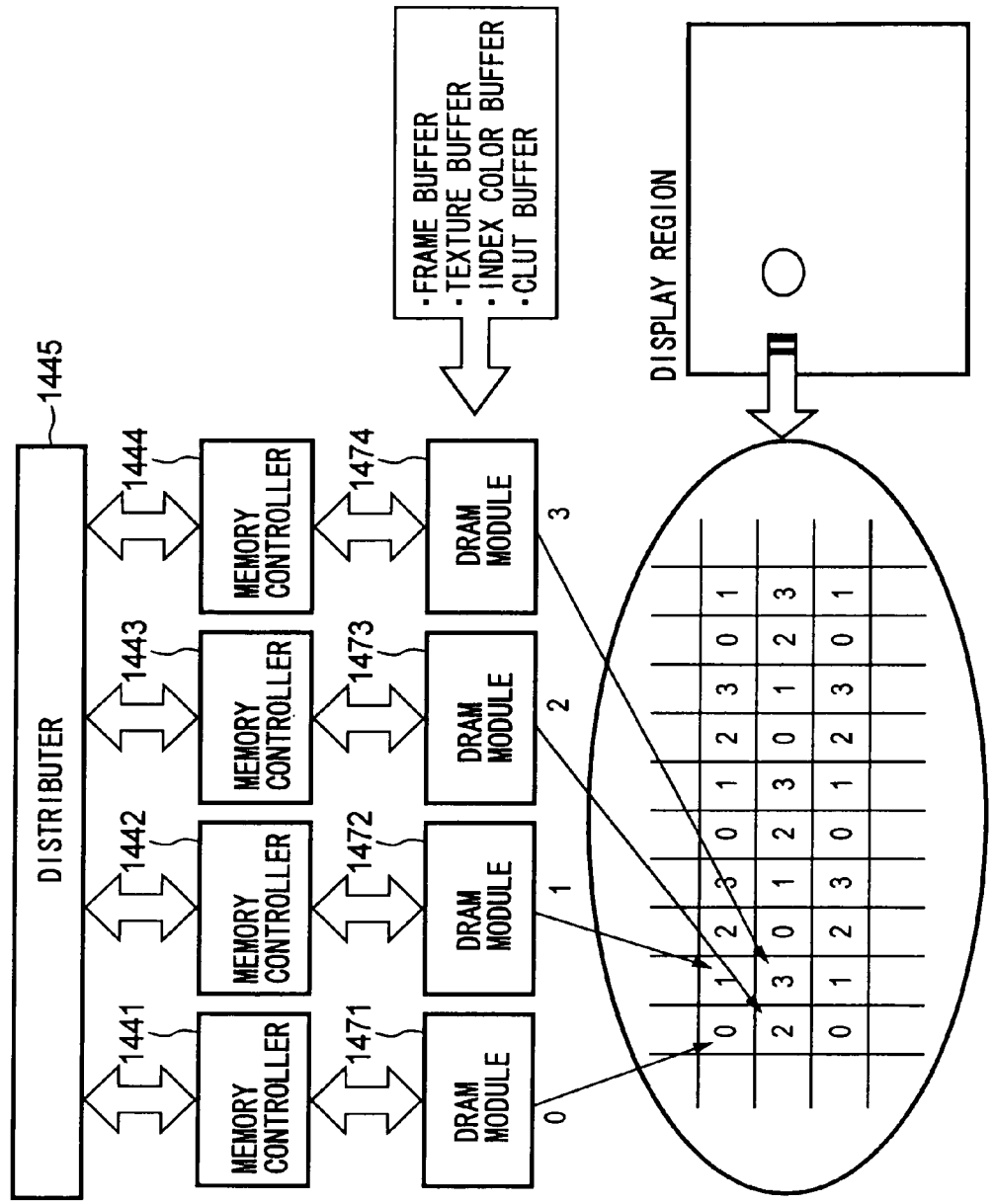
FIG. 2 is a view for explaining a data storing method according to the present invention.

In the present embodiment, the DRAM 147 is, for example, as shown in FIG. 2, divided into four DRAM modules 1471 to 1474. Each of the DRAM modules 1471 to 1474 has, for example, 512 page addresses (row addresses).

The memory I/F circuit 144 is provided with memory controllers 1441 to 1444 corresponding to the DRAM modules 1471 to 1474 and a distributer 1445 for distributing data to the memory controllers 1441 to 1444.

The memory I/F circuit 144 arranges the pixel data in the DRAM modules 1471 to 1474 so that adjacent portions in a display region are stored in different DRAM modules, as shown in FIG. 2.

As a result, it becomes possible to perform processing on a surface when drawing a surface such as a triangle, so the operational probabilities of the DRAM modules become very high.

Further, in order to store more texture data, the DRAM 147 stores indexes in index colors and color look-up table values for the same in the texture CLUT buffer 147*d*.

The indexes and color look-up table values are used for texture processing. Namely, a texture element is normally expressed by the total 24 bits of the 8 bits of each of R, G, and B. With this, however, the amount of data swells, so one color is selected from, for example, 256 colors selected in advance and that data is used for the texture processing. As a result, with 256 colors, the texture elements can be expressed by 8 bits. A conversion table from the indexes to an actual color is necessary, however, the higher the resolution of the texture, the more compact the texture data can become.

Due to this, compression of the texture data becomes possible and the built-in DRAM can be used efficiently.

Further, depth information of the object to be drawn is stored in the DRAM 147 in order to perform hidden plane processing simultaneously and in parallel with the drawing.

Note that as a method of storing the display data, the depth data, and the texture data, for example, the display data are stored continuously from the top of the memory block, then the depth data are stored, and then the texture data are stored in continuous address spaces for each type of texture in the remaining vacant region. As a result, the texture data can be stored efficiently.

Below, a preferable configuration, an arrangement, and an interconnection method of the logic circuit, the DRAM 147, and the secondary memory comprised of the SRAM 148, etc. in the rendering circuit 14 accommodated on the same semiconductor chip according to the present embodiment will be explained with reference to FIG. 3 and FIG. 4.

As will be explained later, the drawing processing is finally reduced to accesses of the individual pixels. Accordingly, ideally, the processings of the individual pixels are simultaneously processed in parallel, whereby the drawing performance can be increased by exactly the number of parallel processings.

To attain the above, a configuration capable of simultaneous parallel processing is adopted in the memory I/F circuit 144 constituting the memory system in the present three-dimensional computer graphics system as well.

In the graphics drawing processing, the processing circuit for processing for writing pixels, etc. has to frequently exchange data with the DRAM.

Figure 3:
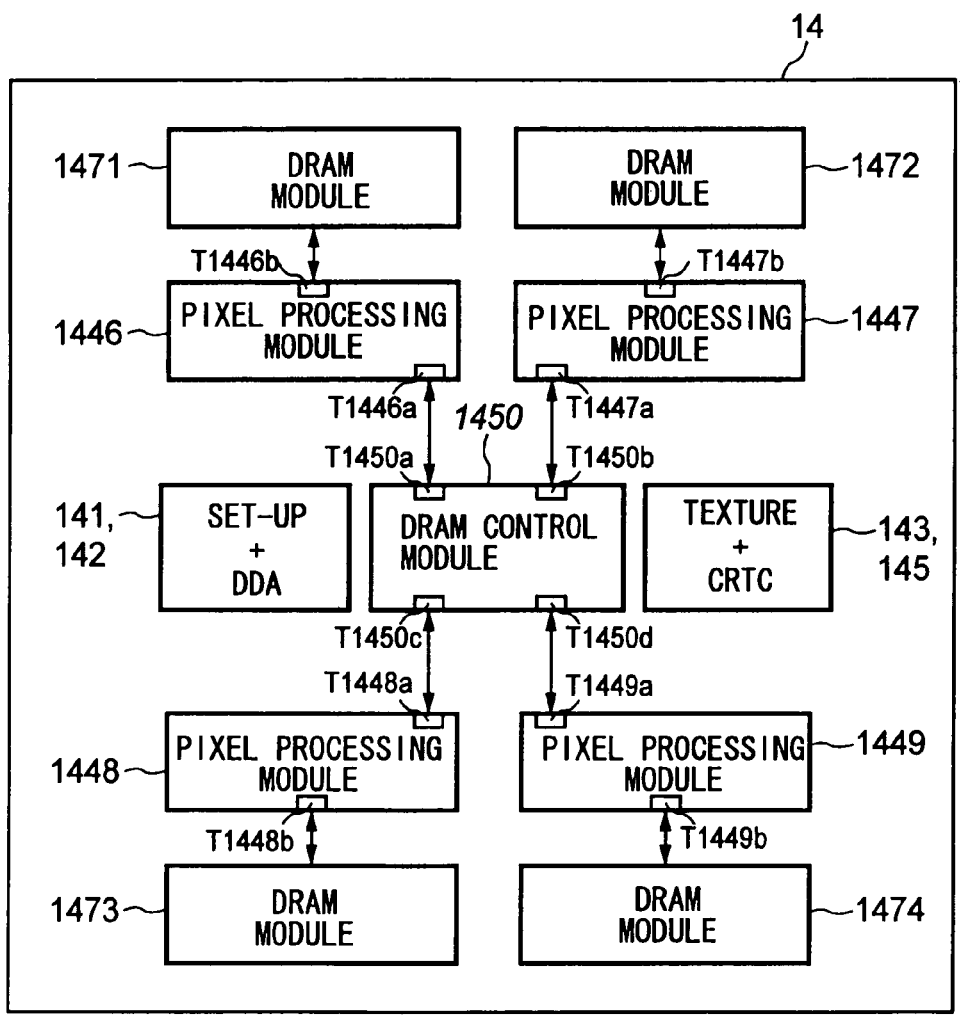
FIG. 3 is a view for explaining the preferable configuration, arrangement, and interconnection method of a logic circuit and a DRAM of a rendering circuit and a secondary memory accommodated on an identical semiconductor chip.

Therefore, in the present embodiment, as shown in FIG. 3, the functional blocks for controlling pixel processing, that is, the pixel processing modules 1446, 1447, 1448, and 1449, are physically separated from the memory controller, and these pixel processing modules 1446, 1447, 1448, and 1449 are arranged close to the corresponding DRAM modules 1471, 1472, 1473, and 1474 (close arrangement).

The pixel processing modules 1446, 1447, 1448, and 1449 compare depth data drawn before for read/modify/write processing of the (R, G, B) colors and hidden plane processing with the depth of data to be drawn next and perform all processing relating to write-back processing in accordance with the result of the comparison.

By performing all of this work in the pixel processing modules 1446, 1447, 1448, and 1449, it becomes possible to complete exchanges with the DRAM in modules with short interconnection lengths to the DRAM modules 1471, 1472, 1473, and 1474.

Thus, even if the number of interconnections to the DRAM, that is, the number of bits for transfer, is large, the ratio of the area occupied by the interconnections in the total area can be kept small, so the operation speed can be improved and the interconnection area can be reduced.

With regard to an inter-DRAM control module 1450, including a distributer, the relation with the DRAM modules (DRAM+pixel processing) is stronger compared with a DDA set up operation of the DDA set-up circuit 141, a triangle DDA operation of the triangle DDA circuit 142, a texture application of the texture engine circuit 143, and display processing by the CRT control circuit 145 as the drawing processing. The number of signal lines with the DRAM modules 1471, 1472, 1473 and 1474 becomes largest.

Therefore, the inter-DRAM control module 1450 is arranged close to the center of the DRAM modules 1471, 1472, 1473, and 1474 to make the longest interconnection length as short as possible.

Furthermore, the signal input/output terminals for connecting the pixel processing modules 1446, 1447, 1448, and 1449 to the inter-DRAM control module 1450 are, as shown in FIG. 3, not made the same as those in the pixel processing modules 1446, 1447, 1448, and 1449. The positions of the input/output terminals in the pixel processing modules are adjusted so that the pixel processing modules and the inter-DRAM control module 1450 are interconnected optimally (shortest).

Specifically, the pixel processing module 1446 is formed with an input/output terminal T1446*a* at the right end side of the module lower rim in FIG. 3. Further, the input/output terminal T1446*a* is arranged so as to face an input/output terminal T1450*a* formed on the left end side of an upper rim of the inter-DRAM control module 1450. The two terminals T1446*a* and T1450*a* are connected by the shortest distance.

Furthermore, the pixel processing module 1446 is formed with an input/output terminal 1446*b* for connecting to the DRAM module 1471 at the center portion of the upper rim in FIG. 3.

The pixel processing module 1447 is formed with an input/output terminal T1447*a* on the left end side of the module lower rim in FIG. 3. The input/output terminal 1447*a* is arranged so as to face an input/output terminal T1450*b* formed on the right end side of the upper rim of the inter-DRAM control module 1450. The two terminals T1447*a* and T1450*b* are connected by the shortest distance.

Furthermore, the pixel processing module 1447 is formed with an input/output terminal T1447*b* for connecting to the DRAM module 1472 at the center portion of the upper rim in FIG. 3.

The pixel processing module 1448 is formed with an input/output terminal T1448*a* on the right end side of the module upper rim in FIG. 3. The input/output terminal T1448*a* is arranged so as to face an input/output terminal T1450*c* formed on the left end side of the lower rim of the inter-DRAM control module 1450. The two terminals T1448*a* and T1450*c* are connected by the shortest distance.

Furthermore, the pixel processing module 1448 is formed with an input/output terminal T1448*b* for connecting to the DRAM module 1473 at the center portion of the lower rim in FIG. 3.

The pixel processing module 1449 is formed with an input/output terminal T1449*a* at the left end side of the module upper rim in FIG. 3. The input/output terminal T1449*a* is arranged so as to face an input/output terminal T1450*d* formed on the right end side of the lower rim of the inter-DRAM control module 1450. The two terminals T1449*a* and T1450*d* are connected by the shortest distance.

Furthermore, the pixel processing module 1449 is formed with an input/output terminal T1449*b* for connecting to the DRAM module 1474 at the center portion of the lower rim in FIG. 3.

Note that the pixel processing modules 1446, 1447, 1448, and 1449 are configured so that even when paths from the DRAM modules 1471, 1472, 1473, and 1474 to the inter-DRAM control module 1450 are made the optimal lengths, as explained above, for processing for which the processing speed request cannot be satisfied, it is possible, for example, to perform at least one stage of pipeline processing divided by registers so as to achieve the desired processing speed.

Figure 4:
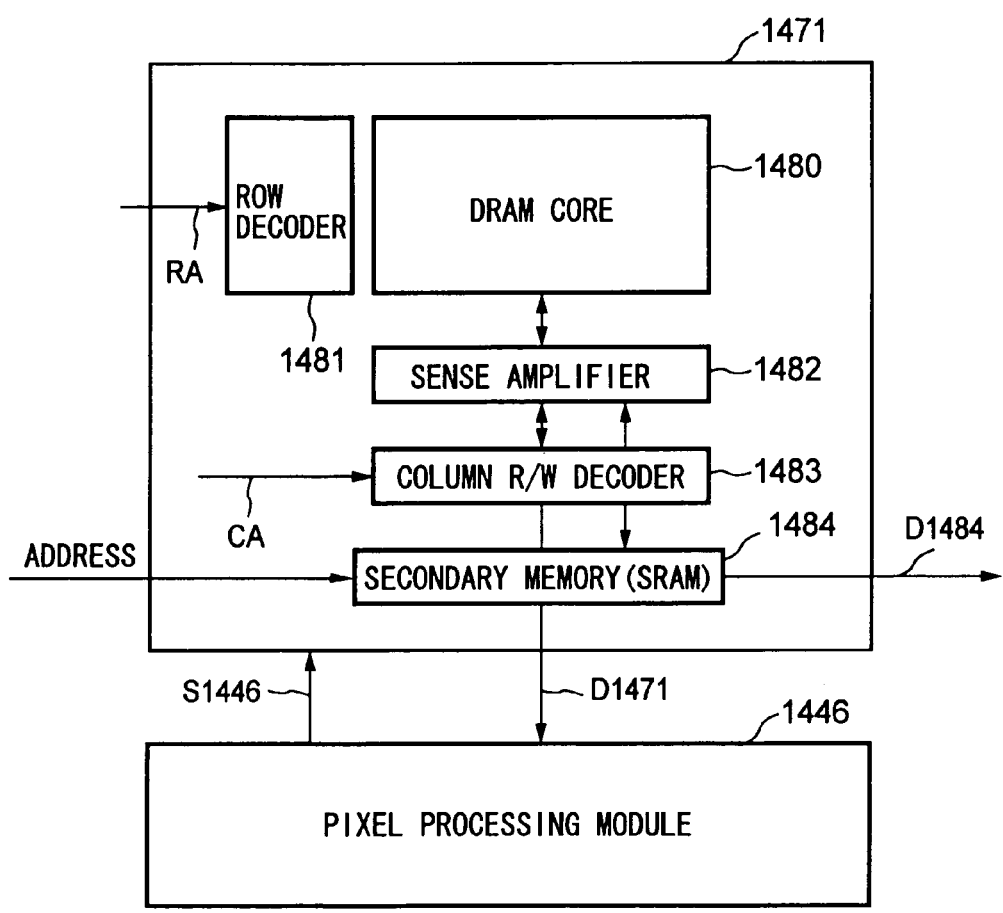
FIG. 4 is a view for explaining an example of the configuration of a DRAM module according to the present invention.

Further, the DRAM modules 1471 to 1474 according to the present embodiment are configured, for example, as shown in FIG. 4. Note that here the example of the DRAM module 1471 will be explained, but the other DRAM modules 1472 to 1474 have similar configurations. Therefore, explanations of the same will be omitted.

The DRAM module 1471, as shown in FIG. 4, is provided with a DRAM core 1480 comprised of memory cells arranged in a matrix and accessed through a not shown word line and bit line selected based on a row address RA and a column address CA, a row decoder 1481, a sense amplifier 1482, a column decoder 1483 and a secondary memory comprised of an SRAM, etc. and provided with the same functions as a so-called cache memory.

As shown in the present embodiment, the pixel processing modules 1446 to 1449 serving as functional blocks for controlling the pixel processing in the graphics drawing and the secondary memories 1484 of the DRAM modules are arranged close to the DRAM modules.

In this case, each DRAM module is arranged so that the long side direction becomes the column direction of the DRAM core 1480.

When looking at random reading in the configuration in FIG. 4, a control signal and a necessary address signal S1446 are supplied from the pixel processing module 1446 to the DRAM module 1471 through an address control path, a row address RA and a column address CA are generated based on supplied signals, and data of the DRAM module corresponding to the desired row are read through the sense amplifier 1482.

The data passed through the sense amplifier 1482 are reduced to the necessary column by the column decoder in accordance with the desired column address CA, then the data D1471 of the DRAM module corresponding to the desired row and column is transferred from a random access port to the pixel processing module 1446 via the path.

When writing data in the secondary memory, a control signal and a necessary address signal S1446 are supplied from the pixel processing module 1446 to the DRAM module 1471 via the address control path. Based on this, only a row address is generated. One row worth of data is written at one time in the secondary memory 1484 comprised of the SRAM 148, etc. from the DRAM.

In this case, since the long-side direction of the DRAM module is arranged to be the column direction of the DRAM core 1480, compared with the case of arrangement in the row direction, by just specifying the row address, it is possible to load one row?s worth of data corresponding to the row address in the secondary memory at one time and therefore greatly increase the number of bits loaded.

Further, data D1484 is read from the secondary memory (SRAM) 1484 to the texture engine circuit 143 serving as the texture processing module by supplying a control signal and a necessary address signal from the texture engine circuit 143 to the DRAM module via the address control path and transferring the data D1484 corresponding thereto to the texture engine circuit 143 via the data path.

Further, in the present embodiment, as shown in FIG. 4, the pixel processing module and the secondary memory of the DRAM module are arranged close to the same long side of the DRAM module.

As a result, the same sense amplifier can be used for data from the pixel processing module and the secondary memory of the DRAM module, so it is possible to keep the increase in area of the DRAM core 1480 to a minimum and attain two ports.

Memory I/F Circuit 144

The memory I/F circuit 144 compares the z-data corresponding to the pixel data S143 input from the texture engine circuit 143 with the z-data stored in the z-buffer 147c, judges whether the image drawn by the input pixel data S143 is positioned closer to the viewing point than the image written in the display buffer 147b the previous time, and, when judging that it is positioned closer, updates the z-data stored in the z-buffer 147c by the z-data corresponding to the image data S143.

Further, the memory I/F circuit 144 writes (R, G, B) data to the display buffer 147b.

Note that the memory I/F circuit 144 accesses the DRAM 147 for 16 pixels simultaneously.

Further, for example as shown in FIG. 1, the memory I/F circuit 144 comprises a refresh mode register 144a.

The refresh mode register 144a is, for example, set with refresh control data RCD by the main processor 11 via the bus 15. The memory I/F circuit 144 refreshes the DRAM modules 1471, 1472, 1473, and 1474 every certain period at a timing based on the refresh control data set in the mode register 144a so as to rewrite and maintain the data held by the cells of the DRAM modules 1471 to 1474.

Note that in the present embodiment, a method of refreshing for a number of times enough to satisfy the standard of the refresh operation in units of the horizontal synchronization signal HSYNC is adopted.

Below, the refresh control based on refresh control data according to the present embodiment will be explained with reference to FIG. 5 to FIG. 12.

Figure 5:
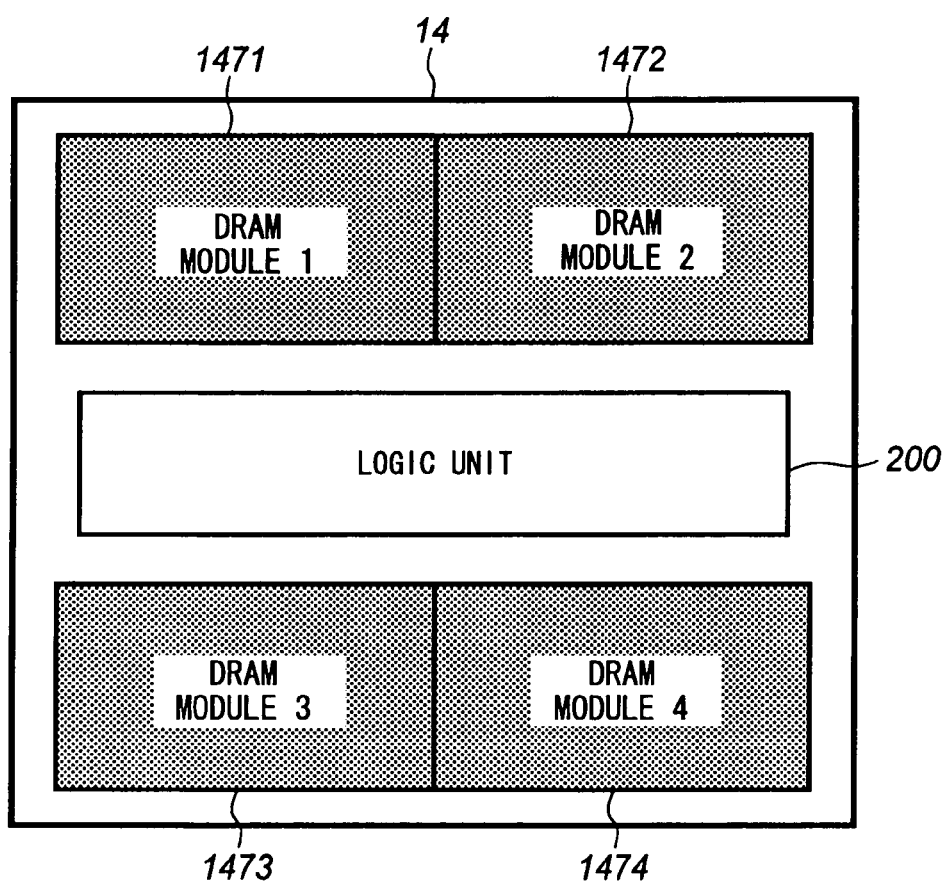
FIG. 5 is a view for explaining a first refresh control according to the present invention and shows a DRAM module to be refreshed.
Figure 7:
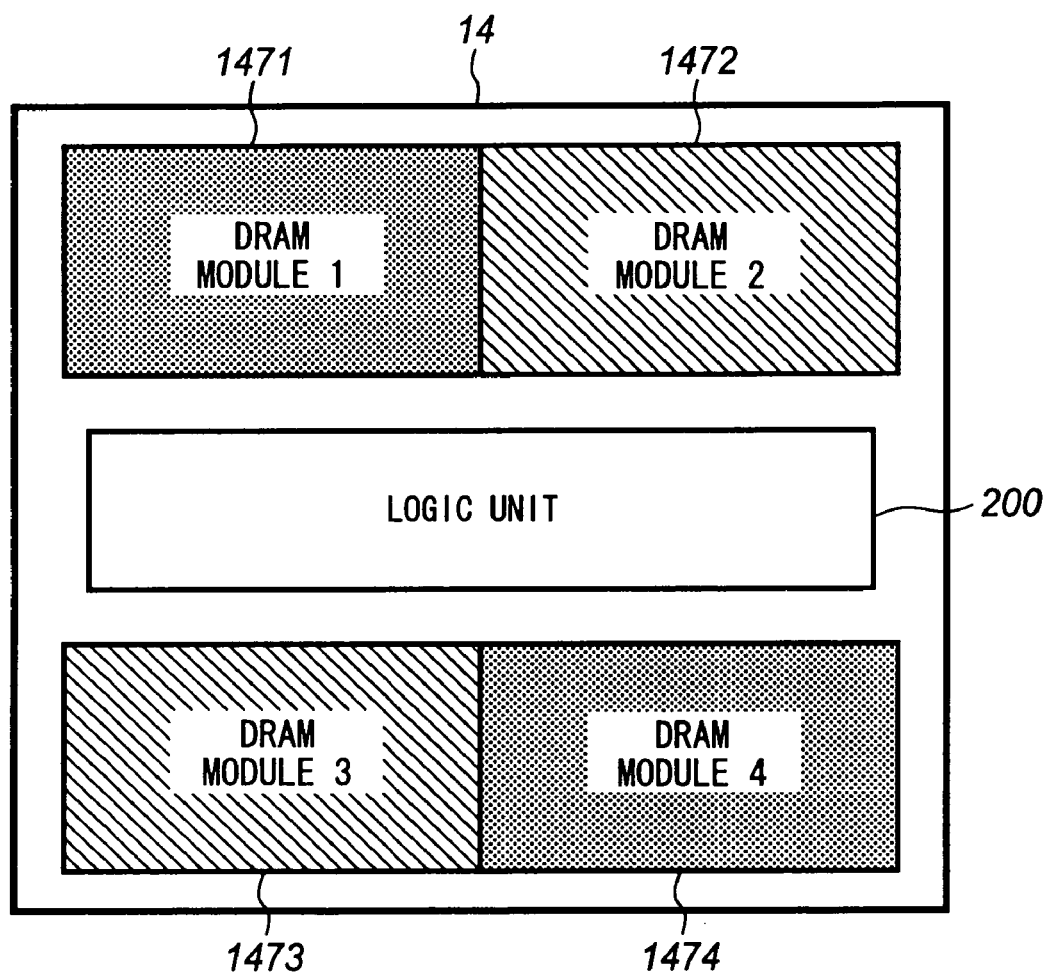
FIG. 7 is a view for explaining a second refresh control according to the present invention and shows DRAM modules to be refreshed.
Figure 8:
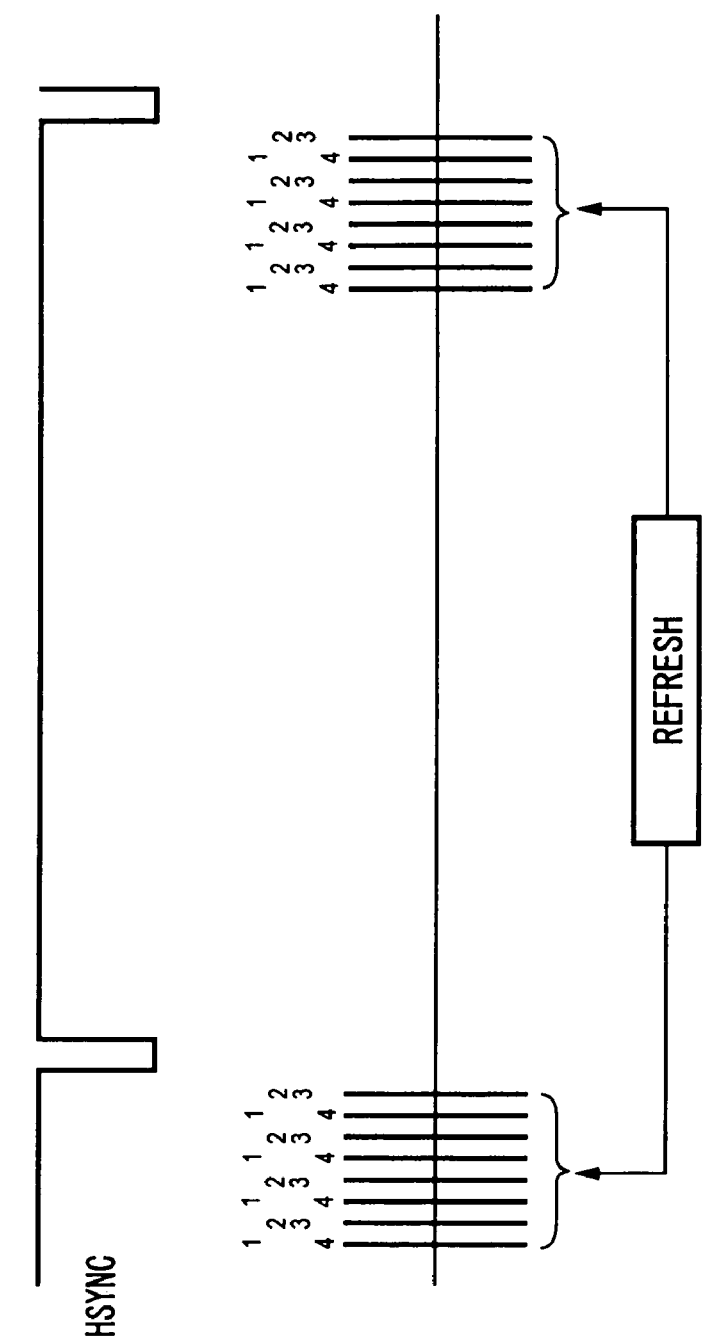
FIGS. 8A and 8B are views for explaining the second refresh control according to the present invention and show timing charts of the second refresh control.
Figure 9:
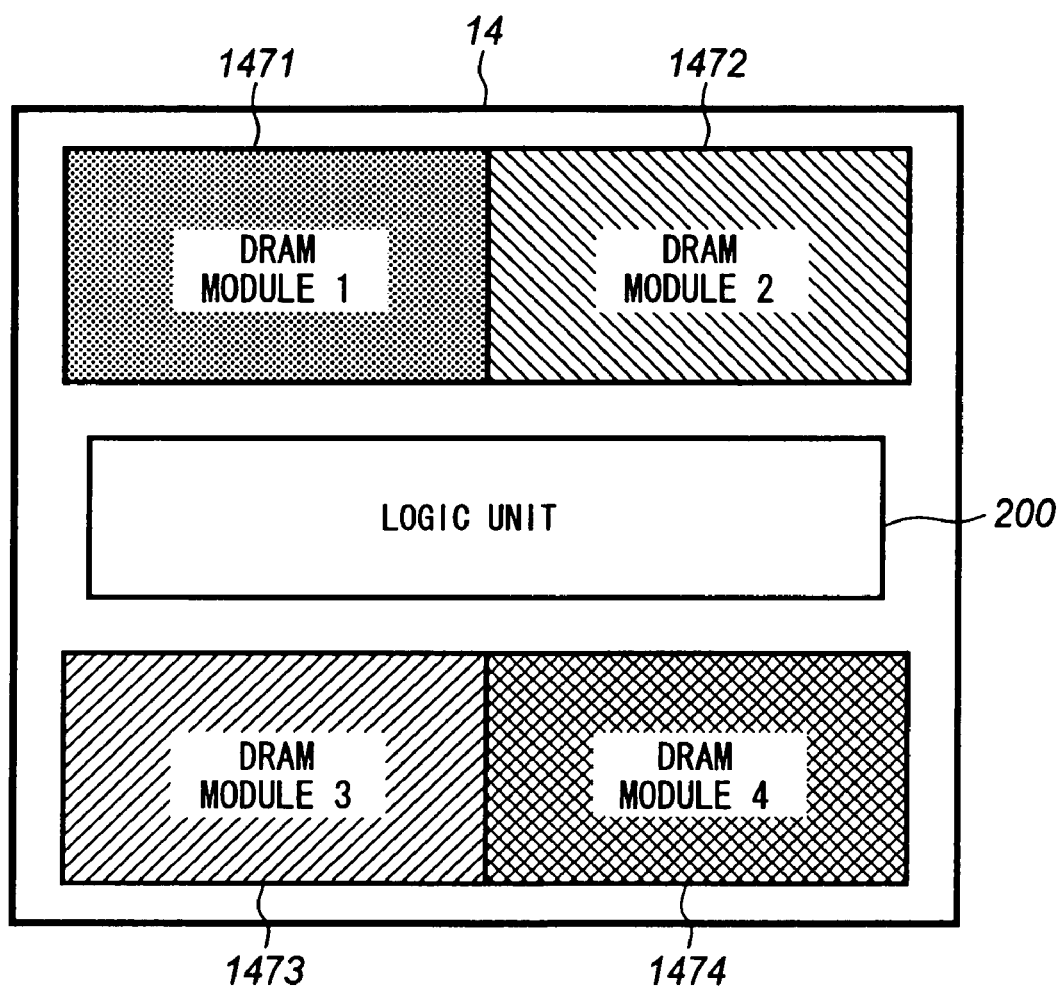
FIG. 9 is a view for explaining a third refresh control according to the present invention and shows DRAM modules to be refreshed.
Figure 10:
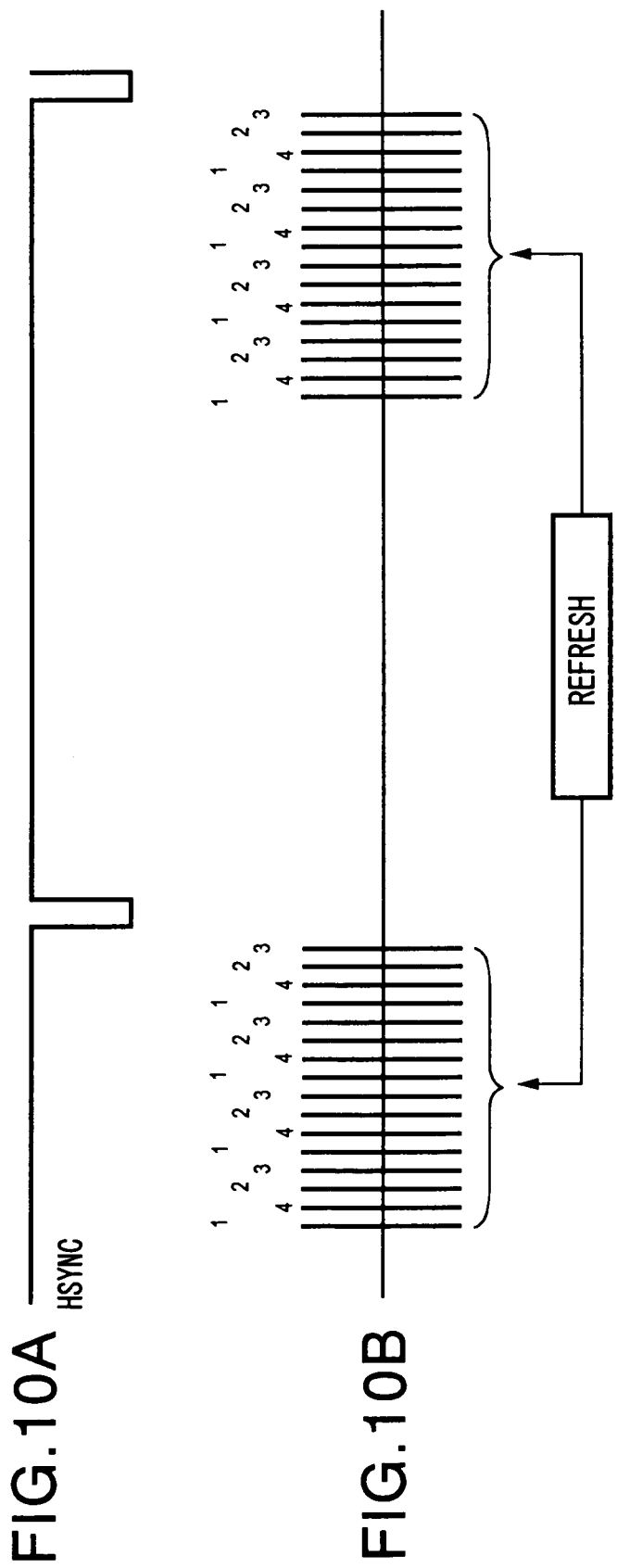
FIGS. 10A and 10B are views for explaining the third refresh control according to the present invention and show timing charts of the third refresh control.

Note that in FIG. 5, FIG. 7, and FIG. 9, the pixel processing modules 1446, 1447, 1448, and 1449, the inter-DRAM control module 1450, the DDA set-up circuit 141, the triangle DDA circuit 142, the texture engine circuit 143, and the CRT control circuit 145 are shown together as a logic unit 200.

Figures 6A, 6B:
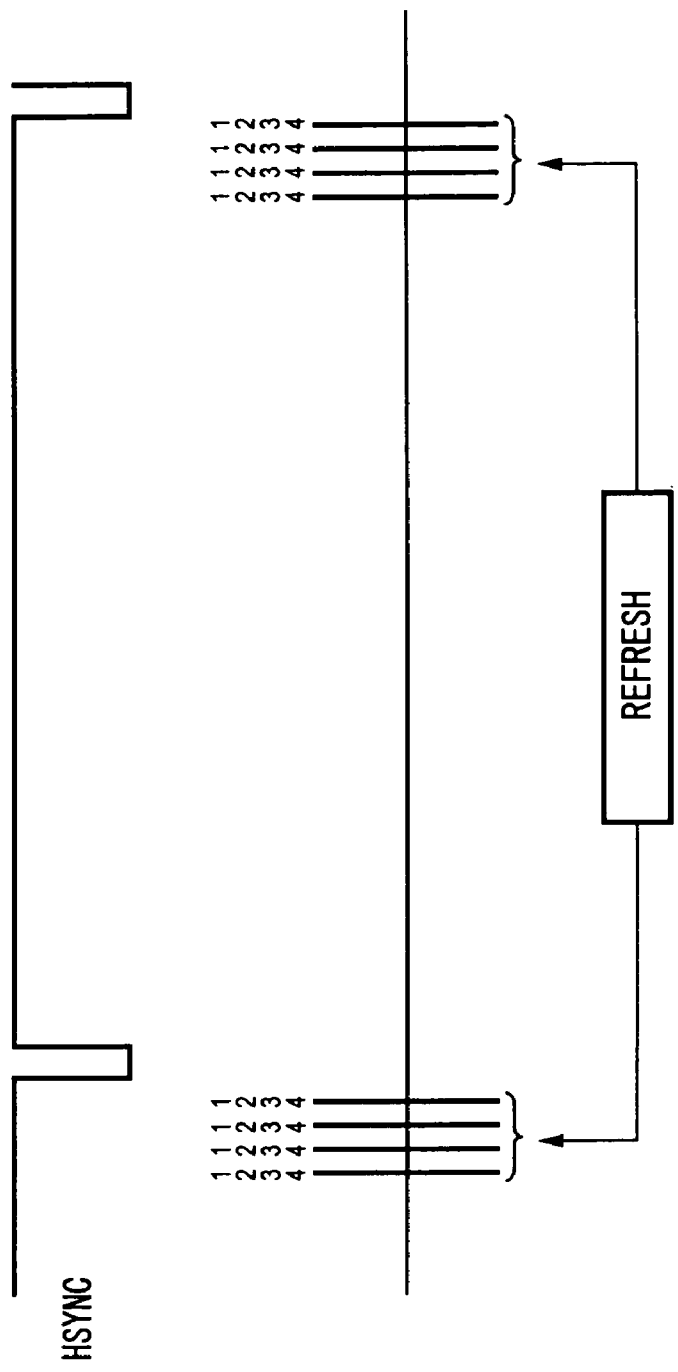
FIGS. 6A and 6B are views for explaining the first refresh control according to the present invention and show timing charts of the first refresh control.

Further, reference number 1 shown in the timing charts in FIG. 6B, FIG. 8B, and FIG. 10B indicates the DRAM module 1471; reference number 2 indicates the DRAM module 1472; reference number 3 indicates the DRAM module 1473 and reference number 4 indicates the DRAM module 1474.

FIG. 5 and FIGS. 6A and 6B are views for explaining a first refresh control, wherein FIG. 5 shows a DRAM module to be refreshed and FIGS. 6A and 6B show timing charts of the first refresh control.

In the case of the first refresh control, for example, refresh control data RCD is set at "0" in a mode register 144a.

In the first refresh control, as shown in FIG. 5 and FIGS. 6A and 6B, the memory I/F circuit 144 refreshes four DRAM modules 1471 to 1474 at one time simultaneously, in the same way as in a normal DRAM.

FIG. 7 and FIGS. 8A and 8B are views for explaining a second refresh control, wherein FIG. 7 shows a DRAM module to be refreshed and FIGS. 8A and 8B show timing charts of the second refresh control.

In the case of the second refresh control, for example, refresh control data RCD is set at the first data "1" in the mode register 144a.

In the second refresh control, as shown in FIG. 7 and FIGS. 8A and 8B, the memory I/F circuit 144 first refreshes the two DRAM modules 1471 and 1474 arranged diagonally across the logic unit 200 simultaneously and next refreshes the two DRAM modules 1472 and 1473 arranged diagonally across the logic unit 200 in the same way simultaneously.

As explained above, in the second refresh control, if the memory I/F circuit 144 were to refresh adjacent DRAM modules arranged on the same rim (side) of the logic unit 200 simultaneously, there would probably be the effect of noise or the effect of a voltage drop etc., so the circuit refreshes the two DRAM modules arranged at different rims (sides) across the logic unit 200 simultaneously and then refreshes the remaining two DRAM modules arranged at the different rims (sides) simultaneously.

Since the DRAM modules arranged at the most distant positions are refreshed simultaneously in the example shown in FIG. 7 and FIGS. 8A and 8B, the combinations of the two DRAM modules are optimal from the viewpoint of the effects of noise, etc., but the present invention is not limited to these.

Namely, it is also possible to refresh the DRAM modules 1471 and 1473 simultaneously and refresh the DRAM modules 1472 and 1474 simultaneously next. Sufficient effects can be obtained by this as well.

FIG. 9 and FIGS. 10A and 10B are views for explaining a third refresh control, wherein FIG. 9 shows a DRAM module to be refreshed and FIGS. 10A and 10B show timing charts of the third refresh control.

In the case of the third refresh control, for example, refresh control data RCD is set to second data "2" in the mode register 144a.

In the third refresh control, as shown in FIG. 9 and FIGS. 10A and 10B, the memory I/F circuit 144 refreshes the four DRAM modules 1471 to 1474 one by one in order at different timings. Note that needless to say the order can be freely changed.

As explained above, in the present embodiment, the memory I/F circuit 144 not only can refresh the four DRAM modules simultaneously, but it also can refresh the two DRAM modules 1471 and 1474 simultaneously, as shown in FIG. 7 and FIGS. 8A and 8B and then the DRAM modules 1472 and 1474 at the next timing, or refresh the four DRAM modules one by one in turn, as shown in FIG. 9 and FIGS. 10A and 10B, and otherwise control each DRAM module.

By making it possible to control the refresh in units of DRAM modules, compared with the case of refreshing four modules simultaneously, the time required for a refresh operation is two times as much when refreshing every two DRAM modules and four times as much when refreshing every module; however, it is possible to estimate the effect given to a circuit by the refresh operation.

Specifically, for example, a function pattern for a refresh is measured by a tester and an operating current in the refresh period is measured so as to estimate the consumption current.

Further, in the case where a RAMDAC 146 for generating an analog signal is provided as in the rendering circuit 14 of the present embodiment or in the case where an analog part is provided together (in the case where an analog/digital (A/D) converter, a digital/analog (D/A) converter, a PLL circuit, etc. is included), an output waveform, etc. of each cell is monitored so as to observe the effect of the refresh operation.

Figure 11:
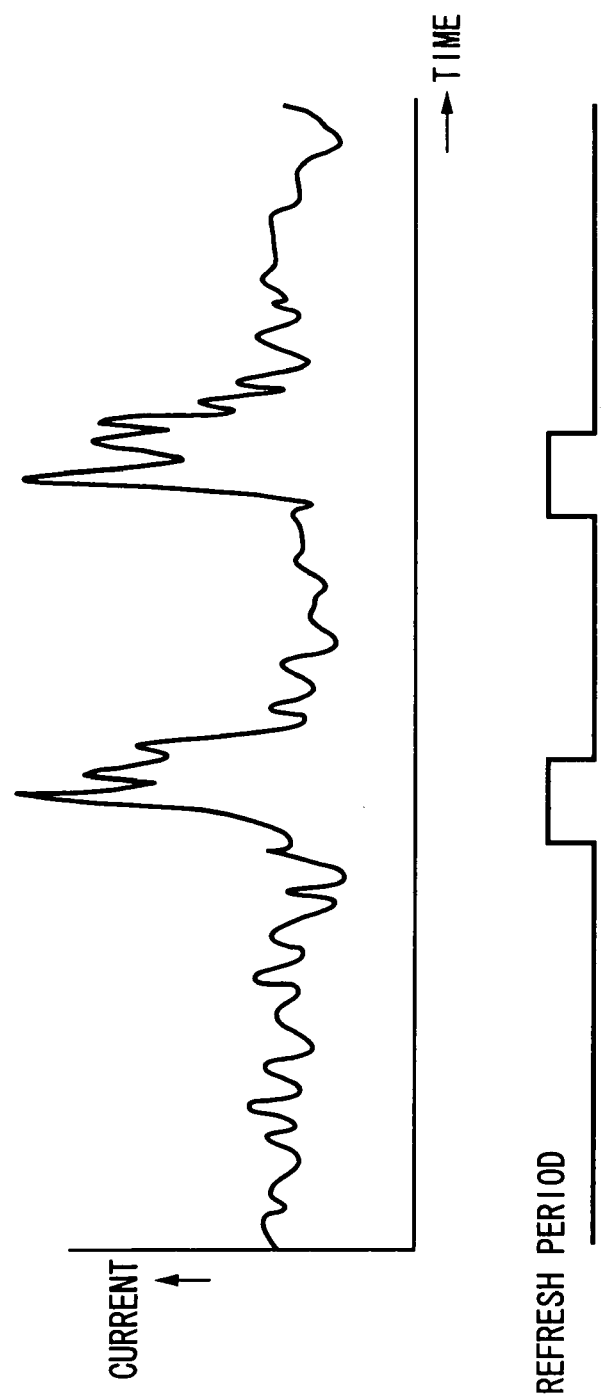
FIGS. 11A and 11B are views of results of measurement of the operating current when controlling the refresh in units of modules and refreshing two DRAM modules simultaneously.

Further, for example, in a measurement of an operating current in the case of refreshing the four DRAM modules two simultaneously by the second refresh control, as shown in FIG. 11, when the current consumption becomes locally large, etc., for example, refresh control data of the mode register 144a of the memory I/F circuit 144 is reset from the first data "1" to the second data "2".

Figure 12:
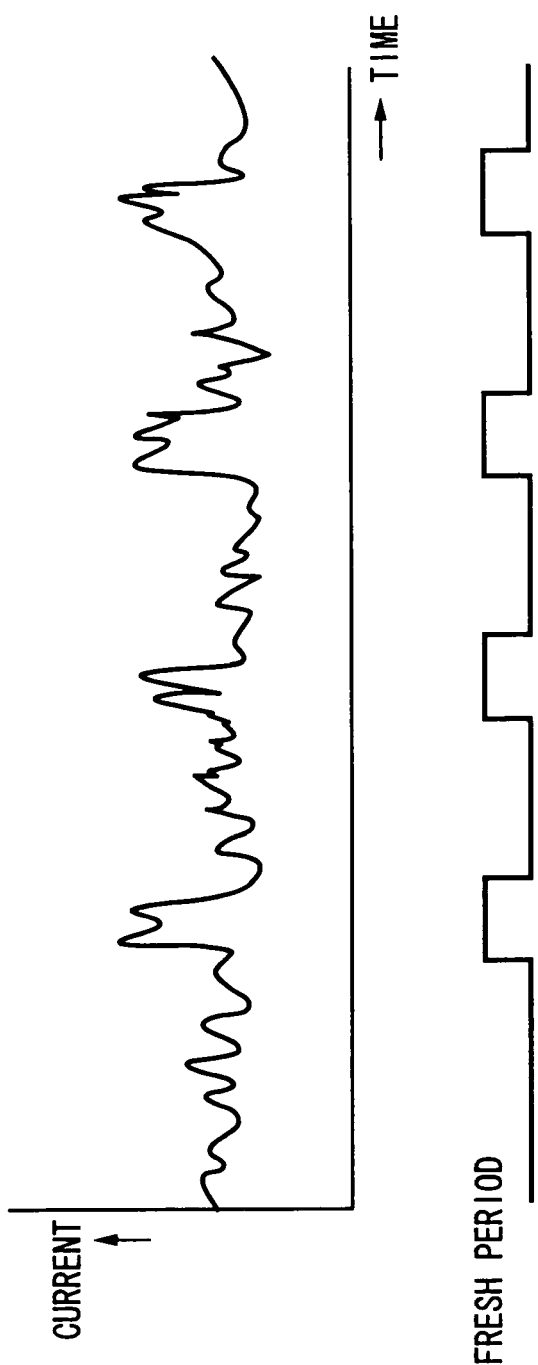
FIGS. 12A and 12B are views of results of measurement of the operating current when controlling the refresh in units of modules and refreshing one DRAM module simultaneously.

In the measurement of the operating current in this case, as shown in FIG. 12, when it is possible to judge that the current consumption is dispersed and the consumption current can be suppressed, it is possible to correctly judge that the refresh operation should be performed not by the second refresh control, but by the third refresh control.

As explained above, by making it possible to control the refresh operation of a large scale DRAM embedded with a logic circuit on the same semiconductor chip in units of divided modules, it is possible to estimate the effect given to a circuit by the refresh operation. When the refresh operation causes a malfunction due to a drop in the ground voltage or noise, control of each DRAM module can contribute to suppression of the consumption current, elimination of malfunctions, and reduction of the package cost.

Figure 13:
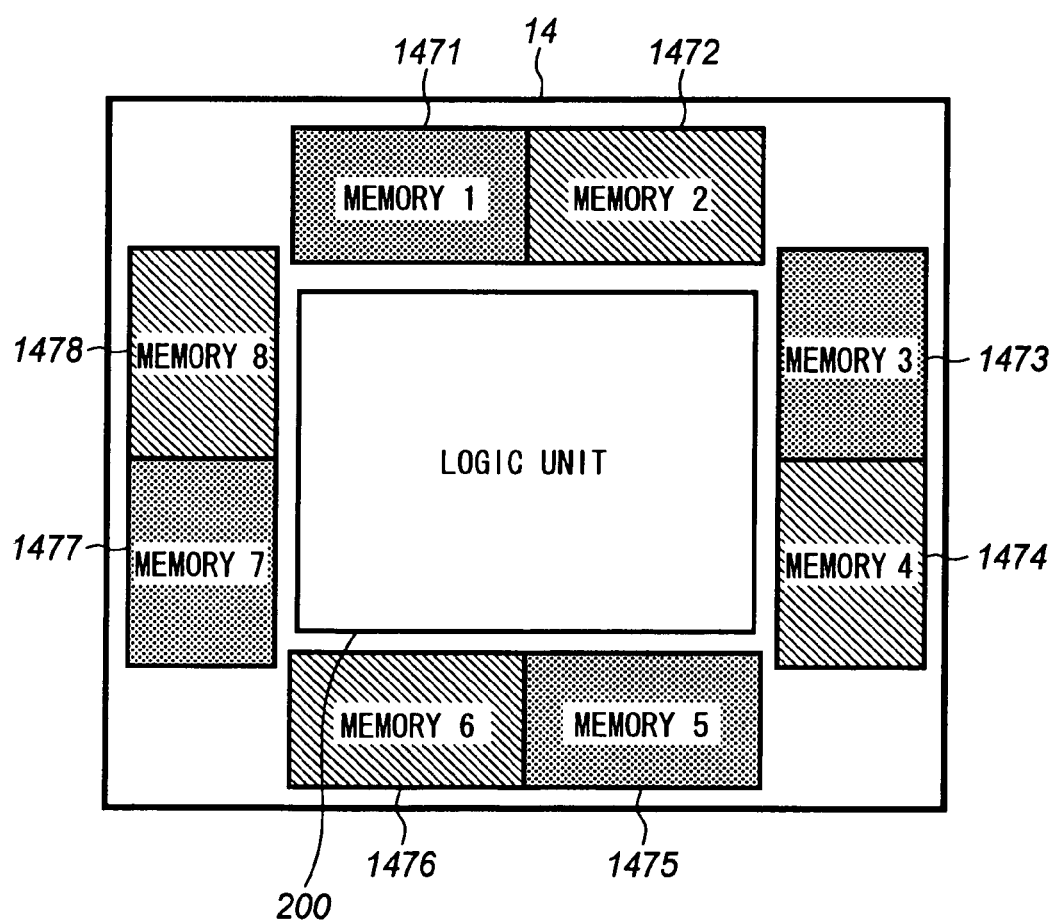
FIG. 13 is a view for explaining the second refresh control when there are eight divided modules.
Figure 14:
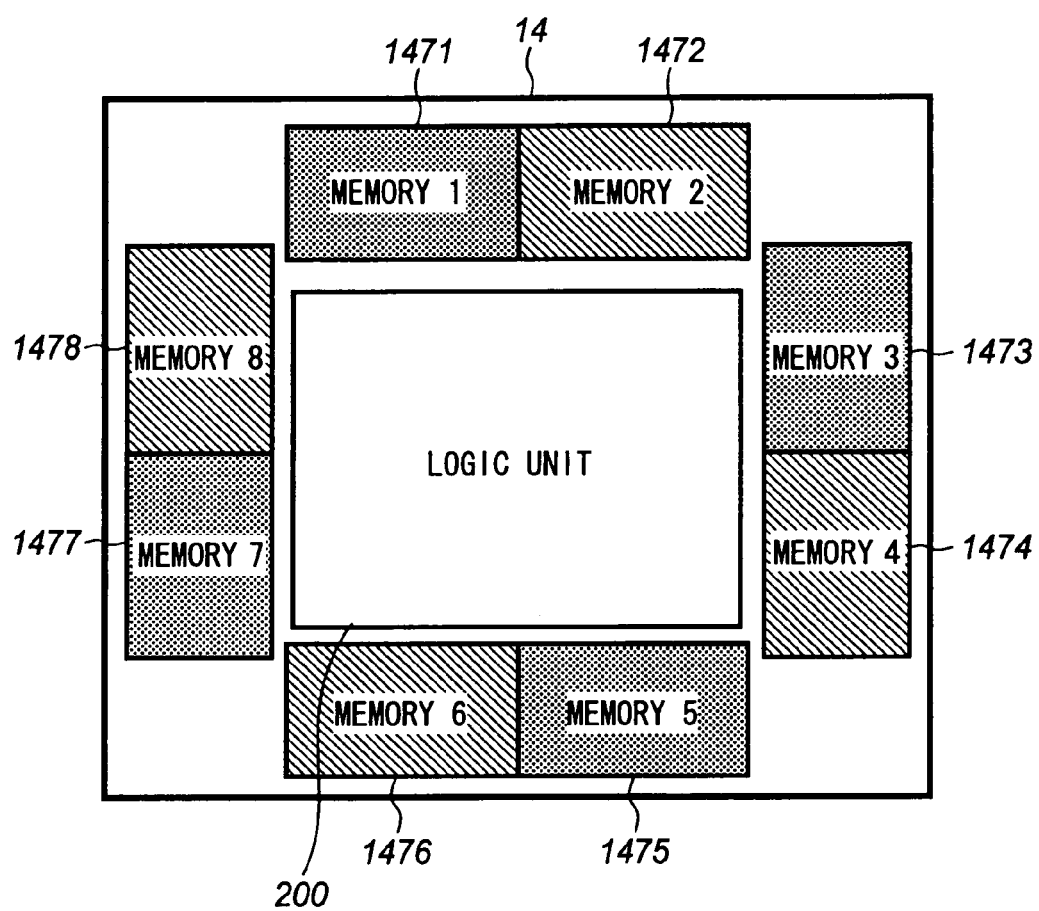
FIG. 14 is a view for explaining the third refresh control when there are eight divided modules.

Note that in the above explanation, a case where the number of four divided modules of the DRAM was explained as an example, but for the example, as shown in FIG. 13 and FIG. 14, the same effect as the above can be obtained by performing the refresh operation by controlling each module or every two modules, even when the number of divided modules is eight, etc.

In FIG. 13 and FIG. 14, the eight divided DRAM modules 1471 to 1478 are arranged two each at the four rims (sides) of the logic unit 200.

The example shown in FIG. 13 shows the case of a second refresh control, wherein the memory I/F circuit 144 refreshes four DRAM modules 1471, 1473, 1475, and 1477 arranged at four different rims (sides) of the logic unit 200 simultaneously, then refreshes the remaining DRAM modules 1472, 1474, 1476, and 1478 arranged at the four different rims (sides) simultaneously.

Note that the combinations of the four DRAM modules to be refreshed simultaneously are not limited to the example in FIG. 13.

The example shown in FIG. 14 is the case of a third refresh control, wherein the I/F circuit 144 refreshes eight DRAM modules 1471 to 1478 one by one in order at different timings. Note that, needless to say, the order can be freely changed.

DDA Set-Up Circuit 141

Before the succeeding triangle DDA circuit 142 linearly interpolates the values of the vertexes of a triangle in a physical coordinate system to obtain information of the color and depth of pixels inside the triangle, the DDA set-up circuit 141 performs a set-up operation for obtaining the difference with a side of the triangle in the horizontal direction, etc. for the data (z, R, G, B, s, t, q) indicated by the polygon rendering data S11.

Specifically, this set-up operation uses the values of a starting point and an end point and the distance between the starting point and end point to calculate the variation of values being sought in the case of movement by a unit length.

The DDA set-up circuit 141 outputs the calculated variation data S141 to the triangle DDA circuit 142.

Figure 15:
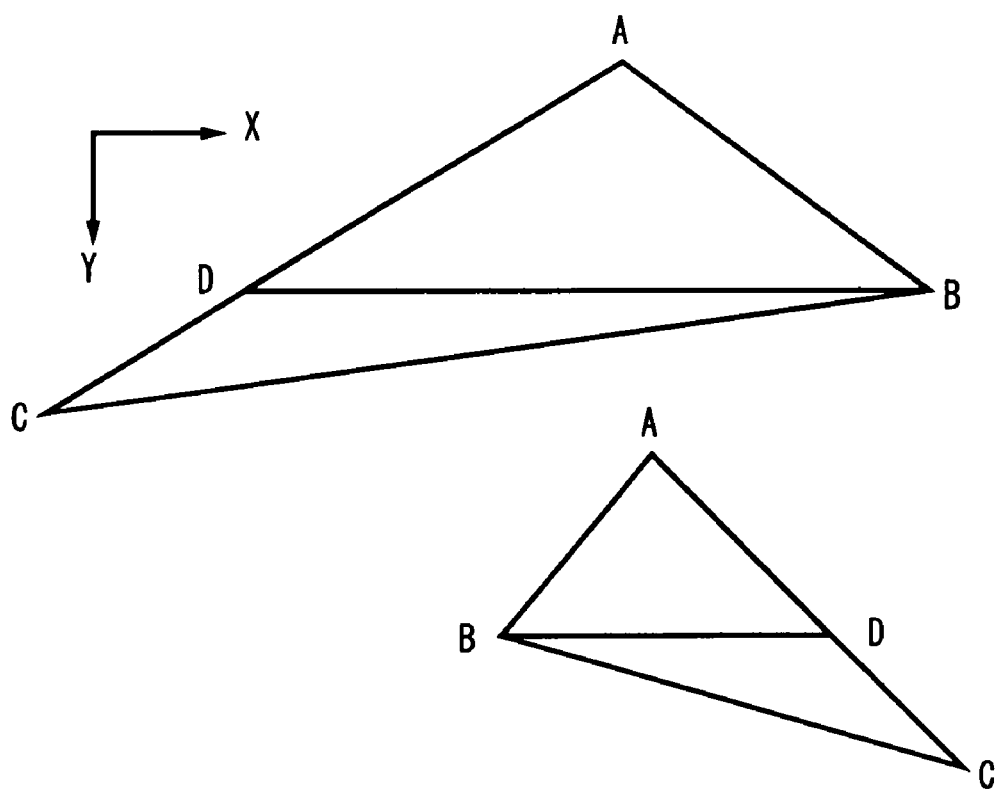
FIG. 15 is a view for explaining the function of a DDA set-up circuit according to the present invention.

The function of the DDA set-up circuit 141 will be further explained with reference to FIG. 15.

As explained above, the main processing of the DDA set-up circuit 141 obtains the variation inside a triangle composed of three vertexes given various information (color and texture coordinates) at vertexes reduced to physical coordinates through previous geometric processing so as to calculate basic data for the later linear interpolation.

Note that the data of each vertex of the triangle are, for example, configured by 16 bits of x- and y-coordinates, 24 bits of the z-coordinate, 12 bits (=8+4) of the color values for the RGB, and 32 bits of floating decimal values (IEEE format) of the s, t, q texture coordinates.

While the drawing of a triangle is reduced to the drawing of a horizontal line, this makes it necessary to obtain the starting values at the starting point of the drawing of the horizontal line.

In drawing the horizontal line, the direction of drawing is made constant in one triangle. For example, when drawing from the left to the right, the X with respect to displacement in the Y-direction at a side on the left and the above various changes are calculated first, then these are used to find the x-coordinate of the leftmost point when moving from a vertex to the next horizontal line and values of the above various information (points on a side change in both the X- and Y-directions, so calculation is impossible only from the gradient of the Y-direction).

Only the position of the end point is required for the side on the right, so only the change of x with respect to the displacement in the Y-direction needs to be investigated.

Regarding the generation of a horizontal line, since the gradient in the horizontal direction is uniform in the same triangle, the gradients of the above various information are calculated.

The given triangle is sorted in the Y-direction and the uppermost point is set to be A. Next, the remaining two vertexes are compared in terms of the positions in the X-direction, and the point on the right is set to be B. By doing this, the processing can be divided into only two or so steps.

Triangle DDA Circuit 142

The triangle DDA circuit 142 uses the variation data S141 input from the DDA set-up circuit 141 to calculate the linearly interpolated (z, R, G, B, s, t, q) data for each pixel inside the triangle.

The triangle DDA circuit 142 outputs the (x, y) data for each pixel and the (z, R, G, B, s, t, q) data at the (x, y) coordinates to the texture engine circuit 143 as the DDA data (interpolated data) S142.

For example, the triangle DDA circuit 142 outputs the DDA data S142 of the 8 (=2×4) pixels positioned inside a block being processed in parallel to the texture engine circuit 143.

Figure 16:
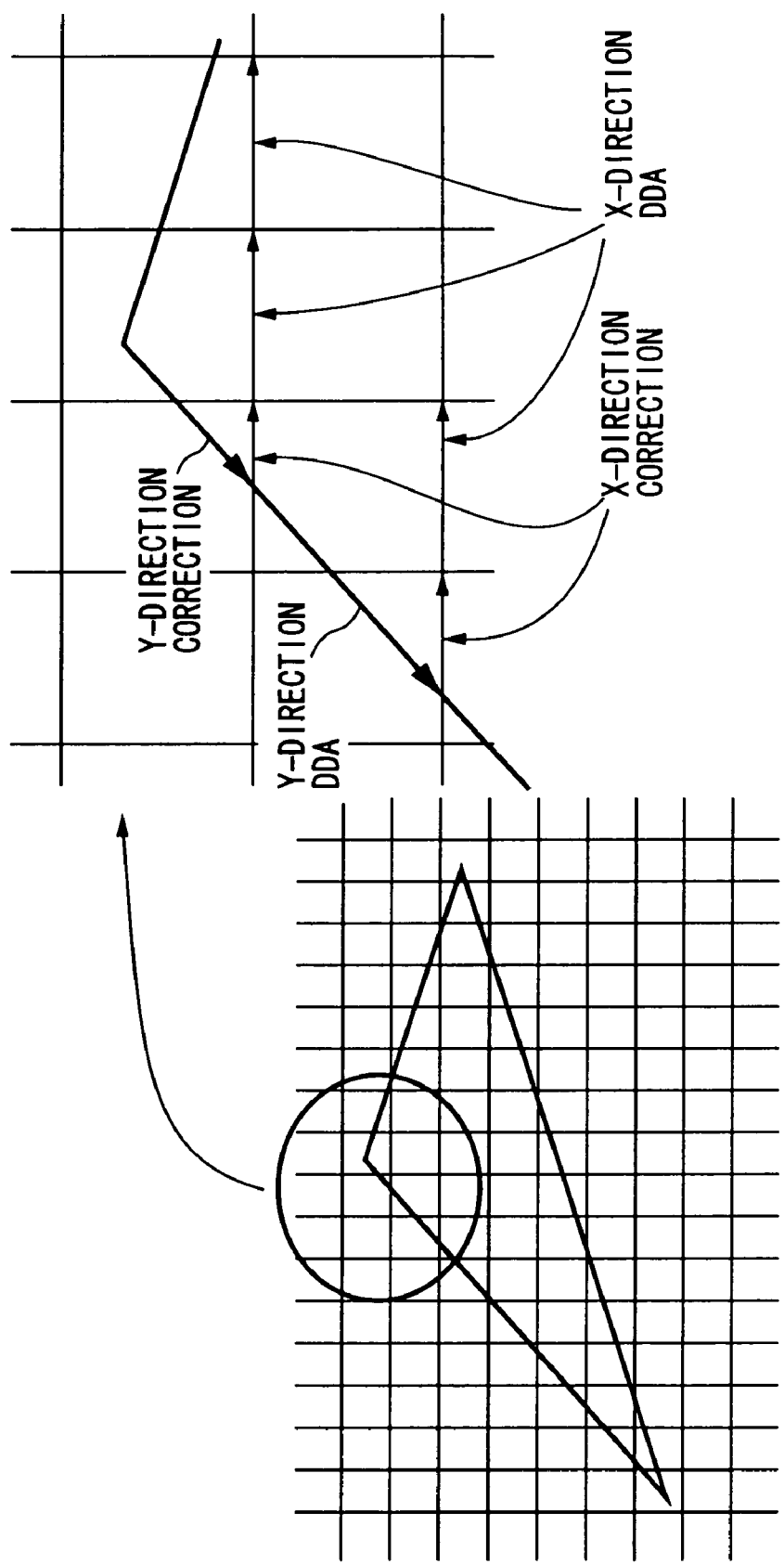
FIG. 16 is a view for explaining the function of a triangle DDA circuit according to the present invention.

A further explanation will be made next of the function of the triangle DDA circuit 142 with reference to FIG. 16.

As explained above, gradient information of the above various information of the sides and horizontal direction of a triangle is prepared by the DDA set-up circuit 141. The basic processing of the triangle DDA circuit 142 receiving this information consists of the calculation of the initial values of the horizontal line by interpolation of the various information of the sides of the triangle and the interpolation of the various information on the horizontal line.

Here, what must be noted most is that the calculation of results of the interpolation requires calculation of the values at the center of a pixel.

The reason is that if the value calculated is off from the center of the pixel, while there is not much to worry about in the case of a still picture, the flickering of the image will become noticeable in a moving picture.

The various information at the leftmost side of a first horizontal line (line naturally connecting the centers of pixels) can be obtained by multiplying the gradient on the side with the distance from the vertex to the first line.

The various information at the starting point of the next line can be calculated by adding the gradient of the side.

The value at the first pixel of the horizontal line can be calculated by adding the value obtained by multiplying the distance to the first pixel with the gradient in the horizontal direction to the value at the starting point of the line. The value at the next pixel of the horizontal line can be calculated by adding to the first pixel value the gradient in the horizontal direction successively.

Next, sorting of vertexes will be explained with reference to FIG. 17.

By sorting the vertexes in advance, the branching of the successive processing can be reduced to a minimum and contradictions can be made harder to occur inside one triangle as much as possible, even in interpolation.

As the method of sorting, first, all of the vertexes supplied are sorted in the Y-direction and the uppermost point and the lowermost point are defined as the point A and point C, respectively. The remaining point is defined as the point B.

By doing so, in the processing, the side extending the longest in the Y-direction becomes a side AC. First, the side AC and the side AB are used for the interpolation of the region between the two sides, then interpolation is performed for the region between the side BC and the side AC, that is, leaving the side AC as it is and changing from the side AB. Further, it will be understood that it is sufficient to perform processing with respect to the side AC and the side BC for correction on the pixel coordinate lattice in the Y-direction.

Since branching of the processing after sorting becomes unnecessary in this way, the processing can be performed by supplying the data, bugs can be prevented from occurring, and the configuration becomes simple.

Further, since the direction of the interpolation in one triangle can be made constant by setting a starting point on the side BC, the direction of interpolation (span) in the horizontal direction becomes constant and any computation errors which occur are accumulated from the side BC to the other sides. Since the direction of the accumulation becomes constant, errors between adjacent sides become less conspicuous.

Next, the calculation of the gradient in the horizontal direction will be explained with reference to FIG. 18.

The gradient (variable) of the variables (x, y, z, R, G, B, s, t, q) inside a triangle with respect to (x, y) becomes constant due to the linear interpolation.

Accordingly, the gradient in the horizontal direction, that is, the gradient on each of the horizontal lines (span), becomes constant for all spans, so the gradient is obtained prior to the processing of the spans.

As a result of sorting the given vertexes of the triangle in the Y-direction, the side AC is defined again to be the longest extending side, so there is always a point of intersection of a line extending from the vertex B in the horizontal direction and the side AC. This point is defined as D.

After this, by just obtaining the change between the point B and D, the gradient in the horizontal direction, that is, in the X-direction, can be obtained.

Specifically, the x- and z-coordinates at the point D become as shown in the equations below.

$$x_d = \{(y_d - y_a)/(y_c - y_a)\} \cdot (x_c - x_a)$$

$$z_d = \{(y_d - y_a)/(y_c - y_a)\} \cdot (z_c - z_a) \quad (1)$$

When obtaining the gradient of the variable z in the X-direction based on this, the following is obtained:

$$\begin{aligned}
\Delta z / \Delta x &= (z_d - z_b)/(x_d - x_b) \quad (2) \\
&= [\{(y_d - y_a)/(y_c - y_a)\} \cdot (z_c - z_a) - z_b]/ \\
&\quad [\{(y_d - y_a)/(y_c - y_a)\} \cdot (x_c - x_a) - x_b] \\
&= \{z_b(y_c - y_a) - (z_c - z_a)(y_c - y_a)\}/ \\
&\quad \{x_b(y_c - y_a) - (z_c - z_a)(y_c - y_a)\}
\end{aligned}$$

Figure 19A:
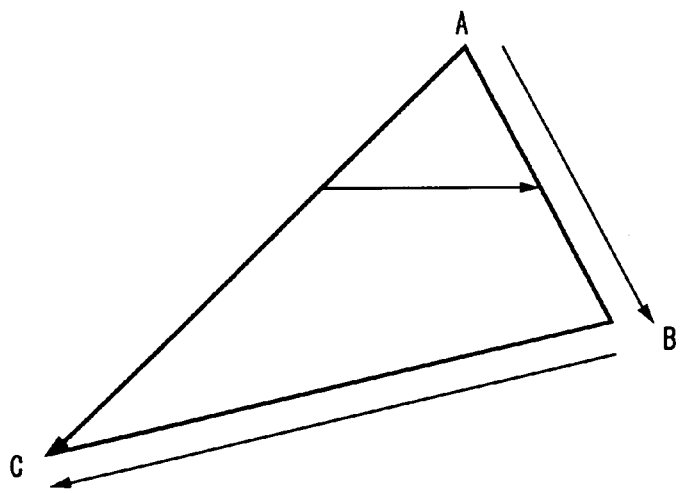
FIG. 19, consisting of FIGS. 19A and 19B, is a view for explaining a routine for interpolation of vertex data of the triangle DDA circuit according to the present invention.
Figure 19B:
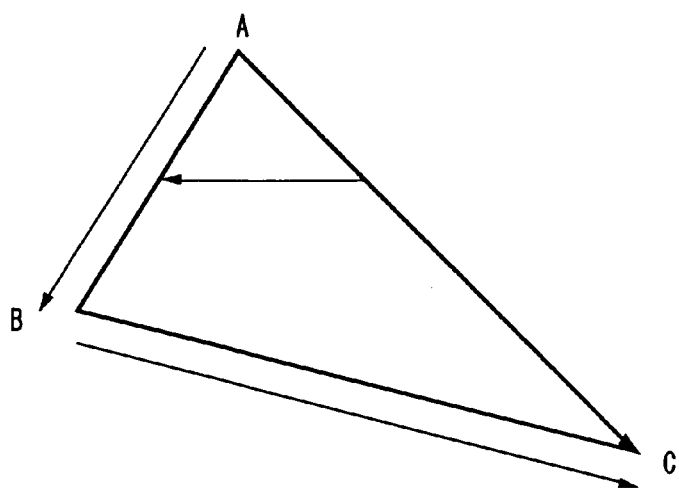
Figure 21:
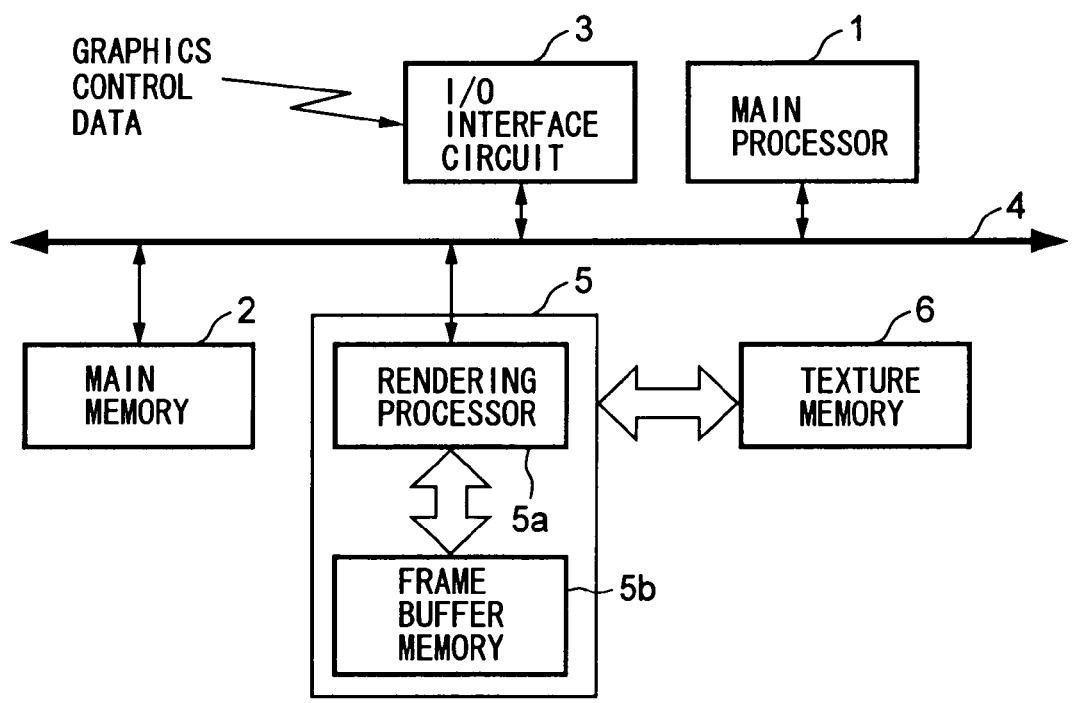
FIG. 21 is a view of the system configuration showing the basic concept of a three-dimensional computer graphics system.

Next, an example of the routine for interpolation of vertex data will be explained with reference to FIG. 19 and FIG. 20.

After the processing for sorting the vertexes, calculating the gradient in the horizontal direction, and calculating the gradient at each of the sides, interpolation is carried out using the results.

Depending on the position of the point B, the processing at a span splits in two directions. This is because it is desired to perform the processing by always using the side extending the longest in the Y-direction as a starting point, so as to try to prevent trouble as much as possible by making the direction of accumulation of errors between spans in interpolation inside one triangle constant.

When the point B is at the same height as the point A, the first half of the processing is skipped. Therefore, the processing can be streamlined by just providing a skippable mechanism rather than branching.

When trying to improve the processing capability by simultaneously processing a plurality of spans, it is desired to obtain the gradient in the Y-direction, however, it is necessary to carry out the processing again from the sorting of the vertexes. However, the processing before the interpolation is enough, so the processing system as a whole becomes simpler.

Specifically, when point B is not the same height as the point A, Y-direction correction of AC and AB (calculation of values on a pixel lattice) is performed (ST1 and ST2) and the interpolation on the side AC and the interpolation on the side AB are performed (ST3).

Then, the correction in the AC horizontal direction and the interpolation on the horizontal line from the side AC in the side AB direction (ST4) are carried out.

The above processings of steps ST3 and ST4 are performed until the end of the side AB (ST5).

When the processing of steps ST2 to ST4 until the end of the side AB is completed or when it is judged at step ST1 that the point B is the same height as the point A, the Y-direction correction of BC (calculation of values on the pixel lattice) is carried out (ST6) and the interpolation on the side AC and the interpolation on the side BC are carried out (ST7).

Then, the correction in the AC horizontal direction and the interpolation on the horizontal line (span) are carried out (ST8).

The processings of the above steps ST7 and ST8 are carried out until the end of the side BC (ST9).

Texture Engine Circuit 143

The texture engine circuit 143 performs the calculation of "s/q" and "t/q", the calculation of the texture coordinate data (u, v), and the reading of the (R, G, B) data from the texture buffer 147a in a pipeline format.

Note that the texture engine circuit 143 performs the processing on the 8 pixels positioned inside a predetermined block simultaneously in parallel.

The texture engine circuit 143 performs the operation for dividing the data s by the data q and the operation for dividing the data t by the data q on the (s, t, q) data indicated by the DDA data S142.

The texture engine circuit 143 is provided with, for example, eight division circuits, not illustrated, and performs the division "s/q" and "t/q" simultaneously on the 8 pixels.

Further, the texture engine circuit 143 respectively multiplies the texture sizes USIZE and VSIZE with the division results "s/q" and "t/q" to generate the texture coordinate data (u, v).

The texture engine circuit 143 outputs a read request including the generated texture coordinate data (u, v) to the SRAM 148 or DRAM 147 via the memory I/F circuit 144. The texture engine circuit 143 obtains the (R, G, B) data S148 stored at the texture address corresponding to the (s, t) data by reading the texture data stored in the SRAM 148 or in the texture buffer 147*a* via the memory I/F circuit 144.

Here, the texture data stored in the texture buffer 147*a* are stored in the SRAM 148.

The texture engine circuit 143 generates pixel data S143 by multiplying, etc. the (R, G, B) data in the read (R, G, B) data S148 and the (R, G, B) data included in the DDA data S142 from the triangle DDA circuit 142 in the former stage.

The texture engine circuit 143 outputs the pixel data S143 to the memory I/F circuit 144.

Note that in the texture buffer 147*a*, MIPMAP (texture for a plurality of resolutions) and other texture data corresponding to a plurality of reducing ratesare stored. Here, which reducing rate texture data to use is determined in the above triangular units using a predetermined algorithm.

In the case of a full color mode, the texture engine circuit 143 directly uses the (R, G, B) data read from the texture buffer 147*a*.

In the case of an index color mode, the texture engine circuit 143 reads a color look-up table (CLUT), prepared in advance, from the texture CLUT buffer 147*d*, transfers and stores the same in the built-in SRAM, and uses the color look-up table to obtain the (R, G, B) data corresponding to the color index read from the texture buffer 147*a*.

CRT Control Circuit 145

The CRT control circuit 145 generates an address for display on a not shown CRT in synchronization with given horizontal and vertical synchronization signals and outputs a request for reading the display data from the display buffer 147*b* to the memory I/F circuit 144. In response to this request, the memory I/F circuit 144 reads a certain amount of the display data from the display buffer 147*b*. The CRT controller 145 has a built-in FIFO circuit for storing the display data read from the display buffer 147*b* and outputs the index value of RGB to the RAMDAC circuit 146 at certain time intervals.

RAMDAC Circuit 146

The RAMDAC circuit 146 stores the R, G, B data corresponding to the index values, and transfers R, G, B data of a digital format corresponding to the index value of RGB input from the CRT controller circuit 145 to a not illustrated digital/analog (D/A) converter to generate R, G, B data of an analog format. The RAMDAC circuit 146 outputs the generated R, G, B data to the CRT.

Next, the overall operation of the three-dimensional computer graphics system in FIG. 1 will be explained.

In the three-dimensional computer graphics system 10, data for drawing graphics, etc. are given from the main memory 12 of the main processor 11 or from the I/O interface circuit 13, which receives graphic data from the outside, to the rendering circuit 14 via the main bus 15.

Note that the data for graphics drawing, etc. are, in accordance with need, subjected to coordinate conversion, clipping, lighting, and other geometric processing in the main processor 11 etc.

The graphics data after the geometric processing becomes polygon rendering data S11 composed of the coordinates x, y, z of the three vertexes of a triangle, the luminance values R, G, B, and the texture coordinates s, t, q corresponding to the pixel to be drawn.

The polygon rendering data S11 is input to the DDA set-up circuit 141 of the rendering circuit 14.

In the DDA set-up circuit 141, variation data S141 indicating the difference of a side of the triangle from a horizontal direction, etc. is generated based on the polygon rendering data S11. Specifically, the variation, that is, the amount of change of the values to be obtained in the case of movement by a unit length, is calculated by using the starting point, the end point, and the distance between the two and output to the triangle DDA circuit 142 as variation data S141.

In the triangle circuit 142, the variation data S141 is used for calculation of the linearly interpolated data (z, R, G, B, s, t, q) of each of the pixels inside the triangle.

Then, the calculated (z, R, G, B, s, t, q) data and the (x, y) data of each of the vertexes of the triangle are output from the triangle DDA circuit 142 to the texture engine circuit 143 as DDA data S142.

In the texture engine circuit 143, the operation for dividing the data s by the data q and the operation for dividing the data t by data q are performed for the (s, t, q) data indicated by the DDA data S142. Then, the texture sizes USIZE and VSIZE are respectively multiplied with the division results "s/q" and "t/q" to generate the texture coordinate data (u, v).

Next, a read request including the generated texture coordinate data (u, v) is output from the texture engine circuit 143 to the SRAM 148 via the memory I/F circuit 144, and the (R, G, B) data S148 stored in the SRAM 148 is read via the memory I/F circuit 144.

Next, in the texture engine circuit 143, the (R, G, B) data in the read (R, G, B) data S148 and the (R, G, B) data included in the DDA data S142 from the triangle DDA circuit 142 in the former stage are multiplied to generate the pixel data S143.

This pixel data S143 is output from the texture engine circuit 143 to the main memory I/F circuit 144.

In the case of a full color mode, the (R, G, B) data read from the texture buffer 147*a* can be directly used, while in the case of an index color mode, data in the color look-up table (CLUT), prepared in advance, are transferred from the texture CLUT buffer 147*d* to a buffer for temporary storage, which is configured by an SRAM, etc. By using the CLUT of the temporary storage buffer, the actual R, G, B colors can be obtained from the color index.

Note that when the CLUT is configured by an SRAM, when a color index is input to an address of the SRAM, the actual R, G, B colors are output.

In the memory I/F circuit 144, the z-data corresponding to the pixel data S143 input from the texture engine circuit 143 and the z-data stored in the z-buffer 147*c* are compared for judging whether the image drawn by the input pixel data S143 is positioned closer to the viewing point than the image written in the display buffer the previous time.

When it is judged that the image drawn by the input pixel data S143 is positioned closer, the z-data stored in the buffer 147*c* are updated by the z-data corresponding to the image data S143.

Next, in the memory I/F circuit 144, the (R, G, B) data are written in the display buffer 147*b*.

In the memory I/F circuit 144, the memory block storing the texture corresponding to the texture address of the pixel to be drawn is calculated from the texture address, a read request is made only to the memory block, and the texture data are read.

In this case, since there is no access for reading texture in memory blocks which do not store the corresponding texture, it is possible to provide more time for access for drawing.

In the same way for drawing, a memory block storing pixel data corresponding to a pixel address to be drawn is accessed to read the pixel data from the corresponding address for modifying writing, the data are modified, and then the data are written back to the same address.

When performing hidden plane processing, again in the same way, a memory block storing depth data corresponding to a pixel address to be drawn is accessed to read the depth data from the corresponding address for modifying writing, the data are modified if necessary, and then the data are written back to the same address.

In such a transfer of data with the DRAM 147 based on the memory I/F circuit 144, the drawing performance can be improved by performing the processing up to here in parallel.

Especially, a plurality of pixels can be simultaneously calculated by the means of partially increasing the operating frequency by providing the triangle DDA circuit 142 and the texture engine 143 portions in the same circuit in a parallel execution mode (spatial parallel) or by inserting a lot of pipelines (time parallel).

Further, the pixel data are arranged so that the adjacent portions in the display region are in different modules under the control of the memory I/F circuit 144.

Due to this, the processing is simultaneously carried out on a plane when generating a plane, such as a triangle. Therefore, the operational probabilities of the DRAM modules are quite high.

Furthermore, in the memory I/F circuit 144, refresh control data RCD is set to the refresh mode register 144a, for example, by the main processor 11 via the bus 15.

In the memory I/F circuit 144, the DRAM modules 1471, 1472, 1473, and 1474 are refreshed every certain period at a timing based on the refresh control data set in the mode register 144a, and data stored in the memory cells of the DRAM modules 1471, 1472, 1473, and 1474 are rewritten and maintained.

For example, when the refresh control data RCD is set to "1" in the mode register 144a, the two DRAM modules arranged at different rims (sides) across the logic unit 200 in the memory I/F circuit 144 are simultaneously refreshed, and then the remaining two DRAM modules arranged on the different rims (sides) are simultaneously refreshed.

Further, for example, when the refresh control data RCD is set to "2" in the mode register 144a, the four DRAM modules 1471 to 1474 in the memory I/F circuit 144 are refreshed one by one in order at different timings.

When displaying an image on a not illustrated CRT, in the CRT control circuit 145, the display address is generated in synchronization with the given horizontal and vertical synchronization frequencies and a request for transferring the display data is sent to the memory I/F circuit 144.

In the memory I/F circuit 144, in accordance with the request, a certain amount of the display data is transferred to the CRT control circuit 145.

In the CRT control circuit 145, the display data are stored in a non-illustrated display use FIFO (First In First Out), etc. and index values of RGB are transferred to the RAMDAC 146 at certain intervals.

In the RAMDAC 146, the RGB values with respect to RGB indexes are stored inside the RAM and the RGB values with respect to the index values are transferred to a not illustrated D/A converter.

Then, the RGB signal converted into an analog signal by the D/A converter is transferred to the CRT.

As explained above, according to the present embodiment, since a DRAM for storing image data and a logic circuit are accommodated on the same semiconductor chip, the DRAM is divided into a plurality of independent DRAM modules 1471 to 1474, the plurality of divided DRAM modules 1471 to 1474 are arranged at the periphery of the logic circuit for the graphics drawing processing, etc., and a memory I/F circuit 144 is provided not only for refreshing the four DRAM modules simultaneously, but also for refreshing two DRAM modules 1471 and 1474 simultaneously and then refreshing the DRAM modules 1472 and 1473 simultaneously or refreshing the four DRAM modules one by one in order based on refresh control data giving the refresh operation of the DRAM, it is possible to control the timing of refresh for every divided DRAM module.

As explained above, since the refresh can be controlled in units of the DRAM modules, the effect given by the refresh on a circuit can be estimated. When the refresh causes a malfunction due to a drop in the power or ground voltage or noise, controlling every DRAM module can contribute to suppression of the power consumption, elimination of malfunctions, and reduction of the package cost.

Further, since the plurality of divided DRAM modules 1471 to 1474 are arranged at the periphery of the logic circuit for the graphics, drawing processing, etc., compared with the case where accesses have to be made simultaneously, the ratio of valid data occupying a bit line at one access is increased. Further, the distances from the DRAM modules 1471 to 1474 to the logic circuit become uniform and, compared with the case of arranging them close to each other in one direction, the length of the longest bus interconnection can be made shorter. Therefore, there is the advantage that the operation speed as a whole can be improved.

Further, since the pixel processing modules 1446 to 1449 serving as the functional blocks for controlling pixel processing in the graphics drawing are closely arranged with respect to the DRAM modules 1471 to 1474, read/modify/write processing performed a large number of times in the graphics drawing can be performed in a very short interconnection area. Therefore, the operation speed can be improved strikingly.

Furthermore, since the pixel processing module and secondary memory of each DRAM module are closely arranged at the same long side of the DRAM module, even if transferring data from the pixel processing module to the secondary memory by a path having a very wide width, the effect of crosstalk is small. Since the interconnection length is naturally short, the operation speed is improved. Further, the area occupied by the interconnections becomes small.

Further, the same sense amplifier can be used for data to the pixel processing module and to the secondary memory. As a result, the increase of the area of the DRAM core can be kept to a minimum and it is possible to realize a port.

Further, the pixel processing modules 1446 to 1449 perform at least one stage of pipeline control internally, so it is possible to stop affecting the throughput of processing data even if the distances to blocks for performing other drawing processing arranged at the center become long on an average. Therefore, the processing speed is improved.

Further, since the inter-DRAM control module 450 is arranged close to the center of the DRAM modules 1471 to 1474, the interconnection regions can be arranged regularly and the average interconnection length can be made shorter.

Further, regarding the signal input/output terminals for connecting the pixel processing modules 1446 to 1449 to the inter-DRAM control module 1450, as shown in FIG. 3, the input/output terminals in the pixel processing modules 1446 to 1449 are not made the same. The positions of the signal input/output terminals in the pixel processing modules are adjusted so that the individual pixel processing modules and the inter-DRAM control module 1450 are optimally interconnected (in the shortest way). Therefore, the block terminals can be placed at optimal positions at the arranged locations and the average interconnection length can be made shorter.

Further, since the long side directions of the memory modules of the DRAM modules 1471 to 1474 are arranged to be the column directions of the DRAM cores, there is an advantage that by just specifying the row address, one row worth of data corresponding to the row address can be loaded in the secondary memory simultaneously, that is, the number of bits is remarkably increased compared with the case of arrangement of the module in the row direction.

Furthermore, since the DRAM 147 built in the semiconductor chip is configured to store display data and texture data required by at least one graphic element, it becomes possible to store the texture data in a portion other than a display region. Thus, the built-in DRAM can be effectively used and an image processing apparatus capable of attaining both a high speed processing operation and a low power consumption can be realized.

Further, a single memory system can be realized and processing can be performed by just built-in components. As a result, there is a large paradigm shift as architecture.

Further, since the memory can be efficiently used, processing only by the DRAM provided therein becomes possible, and the large bandwidth between the memory and the graphics system due to the internal provision can be sufficiently utilized. Further, special processing can be built into the DRAM.

Furthermore, since display elements at adjacent addresses are arranged so as to be stored in different DRAM blocks in a display address space, bit lines can be further effectively used. When there are a large number of accesses to a relatively fixed display region, as in graphics drawing, the probability that the modules can simultaneously perform processing increases and the drawing performance can be improved.

Further, since the indexes in index colors and color lookup table values therefor are stored in the built-in DRAM 147 to enable storage of more texture data, compression of the texture data becomes possible and the built-in DRAM can be used effectively.

Further, since the depth information of an object to be drawn is stored in the built-in DRAM, hidden plane processing can be performed simultaneously and in parallel with drawing.

Normally, it is desirable to display the drawn picture, but it is also possible not to use it directly for display, but to use the drawn data as texture data, because the texture data and display data can be stored in the same memory system as a unified memory.

The above is effective when preparing necessary texture data at a necessary time by drawing. This is also an effective function for preventing the amount of the texture data from swelling.

Further, by building the DRAM in the chip, a high speed interface portion thereof is completed inside the chip, so it becomes unnecessary to drive an I/O buffer having a large additional capacity or an interconnection capacity between chips, and the power consumption becomes smaller compared with the case where a DRAM is not built in.

Accordingly, a framework enabling everything to be done in only one chip by using a variety of techniques is becoming necessary and essential for familiar digital equipment, such as future portable data terminals.

Note that the present invention is not limited to the above embodiments.

Further, while a configuration using the SRAM 147 was explained as an example in the above three-dimensional computer graphics system 10 shown in FIG. 1, the configuration need not be provided with the SRAM 148.

Furthermore, in the three-dimensional computer graphics system 10, a case where geometric processing for generating polygon rendering data was performed in the main processor 11 was explained as an example, but this also may be performed in the rendering circuit 14.

Summarizing the effects of the invention, as explained above, according to the present invention, there are the advantages that a refresh operation can be performed efficiently without causing a drop in performance, an increase of the costs, or damage of the apparatus and the power consumption can be kept low.

Further, it is possible to control the refresh operation of a memory embedded together with a logic circuit in the same semiconductor chip in units of divided module units.

As a result, the effect given on the circuit by the refresh operation can be estimated. When the refresh operation causes a malfunction due to a drop in the power or ground voltage or noise, control of the individual modules enables the power consumption to be kept low, malfunctions to be eliminated, and package costs to be reduced.

Note that the embodiments explained above were described to facilitate the understanding of the present invention and not to limit the present invention. Accordingly, elements disclosed in the above embodiments include all design modifications and equivalents belonging to the technical field of the present invention.

The invention claimed is:

1. An image processing apparatus comprising:
    a memory circuit divided into a plurality of memory modules and storing at least image data and requiring refreshing;
    a logic circuit for performing predetermined processing on the image data based on data stored in said memory circuit,
    said memory circuit and said logic circuit being accommodated on one semiconductor chip; and
    a refresh circuit that refreshes said memory circuit in units based on the number of said divided memory modules,
    wherein said memory circuit is divided into more than two memory modules,
    wherein each unit of the memory circuit includes memory modules that are located on opposite sides of the logic unit, and
    wherein the refresh circuit successively refreshes a plurality of memory modules in units of at least two memory modules when refresh control data given are first data, while it refreshes the plurality of memory modules one by one in a predetermined order when refresh control data given are second data.

2. The image processing apparatus as set forth in claim 1, wherein the refresh circuit successively refreshes the plurality of memory modules in units of at least two memory modules.

3. The image processing apparatus as set forth in claim 1, wherein the refresh circuit refreshes the plurality of memory modules one by one in a predetermined order.

4. The image processing apparatus as set forth in claim 2, wherein the refresh circuit refreshes in units of at least two memory modules, which are at least not adjacent to each other.

5. The image processing apparatus as set forth in claim 1, wherein said refresh circuit successively refreshes the plurality of memory modules in units of at least two memory modules which are at least not adjacent to each other when refresh control data given are first data, while it refreshes the plurality of memory modules one by one in a predetermined order when refresh control data given are second data.

6. An image processing apparatus comprising:
a memory circuit divided into a plurality of memory modules storing at least image data and requiring refreshing;
a logic circuit for performing predetermined processing on the image data based on data stored in said memory circuit,
said memory circuit and said logic circuit being accommodated in one semiconductor chip, and
said plurality of divided memory modules arranged at a periphery of said logic circuit; and
a refresh circuit that refreshes said memory circuit in units based on the number of said divided memory modules,
wherein each unit of the memory circuit includes memory modules that are located on opposite sides of the logic unit, and
wherein the refresh circuit successively refreshes a plurality of memory modules in units of at least two memory modules when refresh control data given are first data, while it refreshes the plurality of memory modules one by one in a predetermined order when refresh control data given are second data.

7. The image processing apparatus as set forth in claim 6, wherein the refresh circuit successively refreshes the plurality of memory modules in units of at least two memory modules.

8. The image processing apparatus as set forth in claim 6, wherein the refresh circuit refreshes the plurality of memory modules one by one in a predetermined order.

9. The image processing apparatus as set forth in claim 6, wherein the refresh circuit successively refreshes a plurality of memory modules in units of at least two memory modules when refresh control data given are first data, while it refreshes the plurality of memory modules one by one in a predetermined order when refresh control data given are second data.

10. The image processing apparatus as set forth in claim 6, wherein
the memory modules are arranged at the periphery of the logic circuit so as to surround said logic circuit, and
said refresh circuit successively refreshes the modules in units of at least two memory modules arranged facing different rims of said logic circuit.

11. The image processing apparatus as set forth in claim 6, wherein the memory modules are arranged at the periphery of the logic circuit so as to surround said logic circuit.

12. The image processing apparatus as set forth in claim 6, wherein
the memory modules are arranged at the periphery of the logic circuit so as to surround said logic circuit, and
said refresh circuit successively refreshes the plurality of memory modules in units of at least two memory modules arranged facing different rims of said logic circuit when refresh control data given are first data, while it refreshes the plurality of memory modules one by one in a predetermined order when refresh control data given are second data.

13. The image processing apparatus as set forth in claim 6, wherein said memory circuit is divided into more than two memory modules.

* * * * *